US012615996B2

(12) United States Patent
Kim et al.

(10) Patent No.: US 12,615,996 B2
(45) Date of Patent: Apr. 28, 2026

(54) SEMICONDUCTOR DEVICE TRANSFER STRUCTURE, DISPLAY APPARATUS, AND METHOD OF MANUFACTURING DISPLAY APPARATUS

(71) Applicant: SAMSUNG ELECTRONICS CO., LTD., Suwon-si (KR)

(72) Inventors: Dongkyun Kim, Suwon-si (KR); Hyunjoon Kim, Seoul (KR); Seogwoo Hong, Yongin-si (KR); Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 571 days.

(21) Appl. No.: 17/708,301

(22) Filed: Mar. 30, 2022

(65) Prior Publication Data

US 2023/0106525 A1     Apr. 6, 2023

(30) Foreign Application Priority Data

Oct. 1, 2021     (KR) ........................ 10-2021-0131140

(51) Int. Cl.
*H01L 21/68*        (2006.01)
*H01L 25/075*       (2006.01)
*H10H 20/01*        (2025.01)

(52) U.S. Cl.
CPC ............. *H01L 21/68* (2013.01); *H10H 20/01* (2025.01); *H01L 25/0753* (2013.01)

(58) Field of Classification Search
CPC ........... H01L 21/68; H01L 2224/95085; H01L 2224/95101; H01L 2224/95136; H01L 2224/95143; H01L 24/95; H01L 25/0753; H01L 25/167; H01L 25/50; H01L 2924/00012; H01L 2924/10156; H01L 2924/12041; H01L 2924/12042;

(Continued)

(56) References Cited

U.S. PATENT DOCUMENTS 6,919,225  B2    7/2005  Craig et al.
7,874,474  B2    1/2011  Kim et al.
2007/0031992 A1    2/2007  Schatz (Continued)

FOREIGN PATENT DOCUMENTS

JP      2002-93824  A      3/2002
KR   10-2010-0108813  A    10/2010

(Continued)

OTHER PUBLICATIONS

Communication dated Sep. 14, 2022, issued by the European Patent Office in counterpart European Application No. 22165918.8.

(Continued)

*Primary Examiner* — Matthew C Landau
*Assistant Examiner* — Dmitriy Yemelyanov
(74) *Attorney, Agent, or Firm* — Sughrue Mion, PLLC

(57) ABSTRACT

A semiconductor device transfer structure, a display apparatus, and a method of manufacturing the display apparatus are provided. The semiconductor device transfer structure includes: a substrate; an alignment layer provided on the substrate and including a trap configured to seat a semiconductor device; and a transfer layer provided on the alignment layer and including a groove.

17 Claims, 23 Drawing Sheets

(58) Field of Classification Search
CPC . H01L 2924/12043; H01L 2924/12044; H01L 2924/1434; H01L 33/005; H01L 33/0095
See application file for complete search history.

(56) References Cited

U.S. PATENT DOCUMENTS

| | | | |
|---|---|---|---|
| 2015/0155445 A1* | 6/2015 | Zhan | H10H 20/01 |
| | | | 269/21 |
| 2017/0179092 A1* | 6/2017 | Sasaki | H01L 25/075 |
| 2018/0033915 A1* | 2/2018 | Crowder | H10H 29/142 |
| 2018/0076168 A1 | 3/2018 | Stecker et al. | |
| 2019/0245126 A1 | 8/2019 | Lim | |
| 2019/0355708 A1 | 11/2019 | Sasaki et al. | |
| 2020/0251451 A1* | 8/2020 | Schuele | H01L 33/486 |
| 2022/0189931 A1 | 6/2022 | Hwang et al. | |
| 2022/0344533 A1 | 10/2022 | Hwang et al. | |
| 2023/0005886 A1 | 1/2023 | Kang et al. | |

FOREIGN PATENT DOCUMENTS

| | | |
|---|---|---|
| KR | 10-1088345 B1 | 11/2011 |
| KR | 10-2020-0026770 A | 3/2020 |
| KR | 10-2020-0030514 A | 3/2020 |
| WO | 2021/177673 A1 | 9/2021 |

OTHER PUBLICATIONS

Communication dated Aug. 2, 2023 issued by the European Patent Office in counterpart European Application No. 22165918.8.

* cited by examiner

SEMICONDUCTOR DEVICE TRANSFER STRUCTURE, DISPLAY APPARATUS, AND METHOD OF MANUFACTURING DISPLAY APPARATUS

CROSS-REFERENCE TO RELATED APPLICATION

This application is based on and claims priority under 35 U.S.C. § 119 to Korean Patent Application No. 10-2021-0131140, filed on Oct. 1, 2021, in the Korean Intellectual Property Office, the disclosure of which is incorporated by reference herein in its entirety.

BACKGROUND

1. Field

Example embodiments of the present disclosure relate to semiconductor device transfer structures, display apparatuses, and methods of manufacturing the display apparatuses.

2. Description of the Related Art

Liquid crystal displays (LCDs) and organic light emitting diode (OLED) displays are widely used as display apparatuses. In recent years, a technology for manufacturing a high-resolution display apparatus using a micro light emitting device is receiving attention.

In a display apparatus using a micro light emitting device, there is a need for technologies such as a transfer technique for moving a micro light emitting device to a pixel position of a desired display apparatus, a repair method (e.g., to repair electrical connection defects), and a method of realizing a desired color.

SUMMARY

One or more example embodiments provide a semiconductor device structure capable of precisely transferring a semiconductor device.

One or more example embodiments provide a display apparatus in which a repair rate is reduced by precisely transferring a semiconductor device.

One or more example embodiments provide a method of manufacturing a display apparatus by precisely transferring a semiconductor device.

Additional aspects will be set forth in part in the description which follows and, in part, will be apparent from the description, or may be learned by practice of the presented embodiments of the disclosure.

According to an aspect of an example embodiment, there is provided a semiconductor device transfer structure including: a substrate; an alignment layer provided on the substrate and including a trap configured to seat a semiconductor device; and a transfer layer provided on the alignment layer and including a groove having a cross-sectional area greater than that of the trap, wherein the trap is located deeper than the groove, and the trap is located to overlap the groove.

The trap may have a size greater than a maximum width of the semiconductor device and less than or equal to 1.2 times the maximum width of the semiconductor device.

The groove may have a size to include two or more semiconductor devices, and the trap may include two or more traps to accommodate the two or more semiconductor devices, respectively.

The substrate may be integrally formed with the alignment layer.

The trap may have a depth corresponding to 0.1 to 0.2 times a thickness of the semiconductor device.

The groove may have a depth corresponding to 0.5 to 1 times a thickness of the semiconductor device.

The trap may be arranged to deviate from a center of the groove to one side of the groove.

The trap may have a depth ranging from 0.1 to 0.2 times a depth of the groove.

The groove may include a transfer area for accommodating a transfer semiconductor device and a preliminary area for accommodating a preliminary semiconductor device, and the trap may be provided to correspond to the transfer area.

According to an aspect of an example embodiment, there is provided a display apparatus including: a substrate; an alignment layer provided on the substrate and including a trap configured to seat a semiconductor device; a transfer layer provided on the alignment layer and including a groove having a cross-sectional area greater than that of the trap; a semiconductor device arranged in the trap; and a driving circuit configured to drive the semiconductor device, wherein the trap is located deeper than the groove, and the trap is located to overlap the groove.

The trap may have a size greater than a maximum width of the semiconductor device and less than or equal to 1.2 times the maximum width of the semiconductor device.

The groove may have a size to include two or more semiconductor devices, and the trap may include two or more traps to accommodate the two or more semiconductor devices, respectively.

The substrate may be integrally formed with the alignment layer.

The trap may have a depth ranging from 0.1 to 0.2 times a depth of the groove.

The groove may have a depth corresponding to 0.5 to 1 times a thickness of the semiconductor device.

The trap may be arranged to deviate from a center of the groove to one side of the groove.

The semiconductor device may include a protrusion, and the trap may have a plan view shape corresponding to a plan view shape of the protrusion.

An electrode of the semiconductor device may be provided in the protrusion.

The driving circuit may be provided in the substrate.

The driving circuit may be provided on the transfer layer.

The semiconductor device may include at least one of a light emitting diode (LED), a complementary metal-oxide semiconductor (CMOS), a CMOS image sensor (CIS), a vertical-cavity surface-emitting laser (VCSEL), a photodiode (PD), a memory device, or a two-dimensional (2D) material device.

According to an aspect of an example embodiment, there is provided a structure for transferring a semiconductor device, the structure including: a substrate; an alignment layer provided on the substrate, the alignment layer including a first area and a second area, wherein a surface adhesion of the second area is greater than a surface adhesion of the first area; and a transfer layer provided on the alignment layer, the transfer layer including a groove provided to overlap at least the second area.

A surface roughness of the second area may be less than a surface roughness of the first area.

The first area may include a hydrophobic material, and the second area may include a hydrophilic material.

The substrate may be integrally formed with the alignment layer.

According to an aspect of an example embodiment, there is provided a method of manufacturing a display apparatus, the method including: forming an alignment layer including a trap; forming a transfer layer on the alignment layer and including a groove that is stepped with respect to the trap, the transfer layer having a cross-sectional area greater than a cross-sectional area of the trap; positioning a semiconductor device in the groove; and aligning the semiconductor device with the trap.

The trap may have a size greater than a maximum width of the semiconductor device and less than or equal to 1.2 times the maximum width of the semiconductor device.

The groove may have a size to include two or more semiconductor devices, and the trap may include two or more traps to accommodate the two or more semiconductor devices, respectively.

The trap may have a depth corresponding to 0.1 to 0.2 times a thickness of the semiconductor device.

The method may further include transferring the semiconductor device to a driving substrate, the driving substrate including a circuit for driving the semiconductor device.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1:
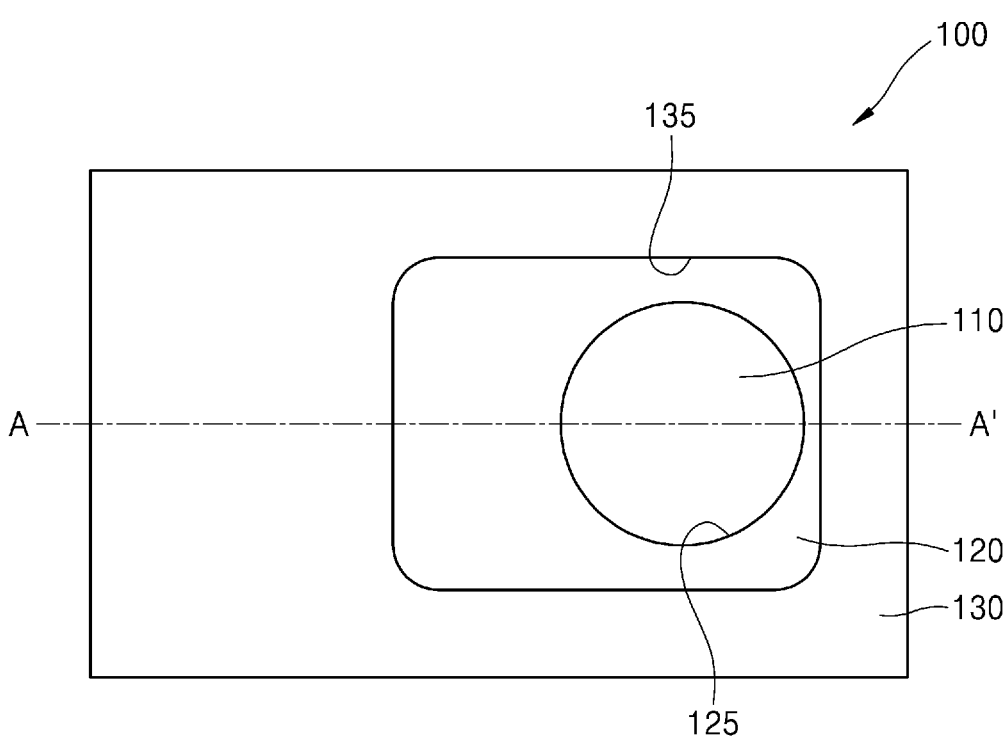
FIG. 1 is a schematic plan view of a semiconductor device transfer structure according to an example embodiment.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the disclosure. As used herein, the term "and/or" includes any and all combinations of one or more of the associated listed items. Expressions such as "at least one of," when preceding a list of elements, modify the entire list of elements and do not modify the individual elements of the list.

Hereinafter, a semiconductor device transfer structure, a display apparatus, and a method of manufacturing the display apparatus will be described in detail with reference to the accompanying drawings. The same reference numerals refer to the same elements throughout. In the drawings, the sizes of constituent elements may be exaggerated for clarity. Though terms like 'first' and 'second' are used to describe various elements, the elements are not limited to these terms. These terms are used only to differentiate an element from another element.

As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added. Also, thicknesses or sizes of elements in the drawings are exaggerated for convenience and clarity of description. Furthermore, when an element is referred to as being "on" or "above" another element, it may be directly on the other element, or intervening elements may also be present. Moreover, the materials constituting each layer in the following embodiments are merely examples, and other materials may be used.

In addition, the terms "-er", "-or", and "module" described in the specification mean units for processing at least one function and/or operation and can be implemented by hardware components or software components and combinations thereof.

The particular implementations shown and described herein are illustrative examples of the inventive concept and are not intended to otherwise limit the scope of the inventive concept in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a," "an," and "the" and similar referents is to be construed to cover both the singular and the plural.

Operations constituting a method may be performed in any suitable order unless explicitly stated that they should be performed in the order described. Further, the use of any and all examples, or exemplary language (e.g., "such as") provided herein, is intended merely to better illuminate the inventive concept and does not pose a limitation on the scope of the present disclosure unless otherwise claimed.

Figure 2:
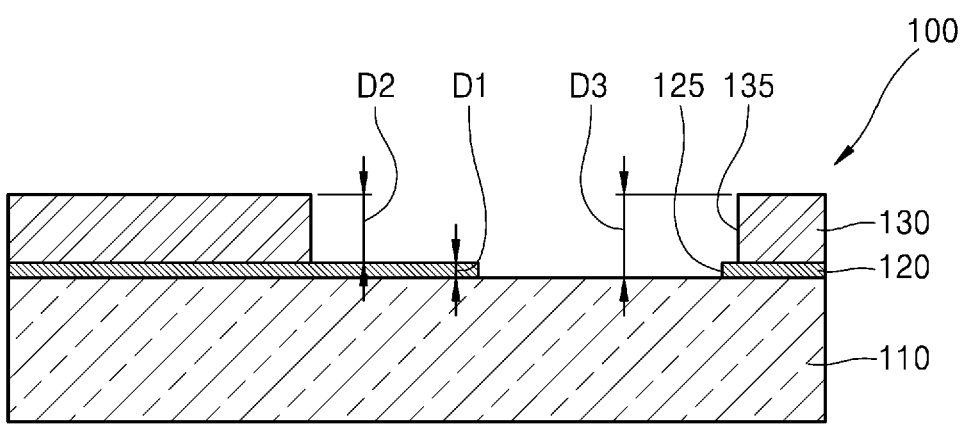
FIG. 2 is a cross-sectional view of the semiconductor device transfer structure taken along line A-A' of FIG. 1.

FIG. 1 is a plan view of a semiconductor device transfer structure according to an example embodiment, and FIG. 2 is a cross-sectional view of the semiconductor device transfer structure taken along line A-A' of FIG. 1.

A semiconductor device transfer structure 100 includes a substrate 110, an alignment layer 120 provided on the substrate 110 and including a trap 125, and a transfer layer 130 provided on the alignment layer 120 and including a groove 135.

The substrate 110 may include, for example, an organic material such as silicon, glass, sapphire, a polymer, an inorganic material, and/or a metal. The alignment layer 120 may be formed of the same material as that of the substrate 110, but is not limited thereto. The semiconductor device transfer structure 100 may be formed of a silicon on insulator (SOI) substrate. Alternatively, the alignment layer 120 of the semiconductor device transfer structure 100 may be formed of a flexible film or a flexible mold including a plurality of traps 125. The transfer layer 130 may be made of $SiO_2$, Si, SiN, and/or photoresist. However, the material of the transfer layer 130 is not limited thereto. The trap 125 may have a size slightly greater than that of a semiconductor device 150 (of FIG. 3) to seat the semiconductor device 150. The size of the trap 125 is described later below.

The groove 135 may have a greater cross-sectional area than that of the trap 125 and may entirely cover the trap 125. The trap 125 may be located deeper than the groove 135, with respect to an upper surface of the semiconductor device transfer structure 100, and the trap 125 may be located to overlap the groove 135. Accordingly, the trap 125 may have a stepped structure with respect to the groove 135. The depth of the trap 125 is D1, the depth of the groove 135 is D2, and the depth from an upper surface of the transfer layer 130 to an upper surface of the substrate 110 is D3. The depth D1 of the trap 125 may range from 0.1 to 0.2 times the depth D2 of the groove 135.

Figure 3:
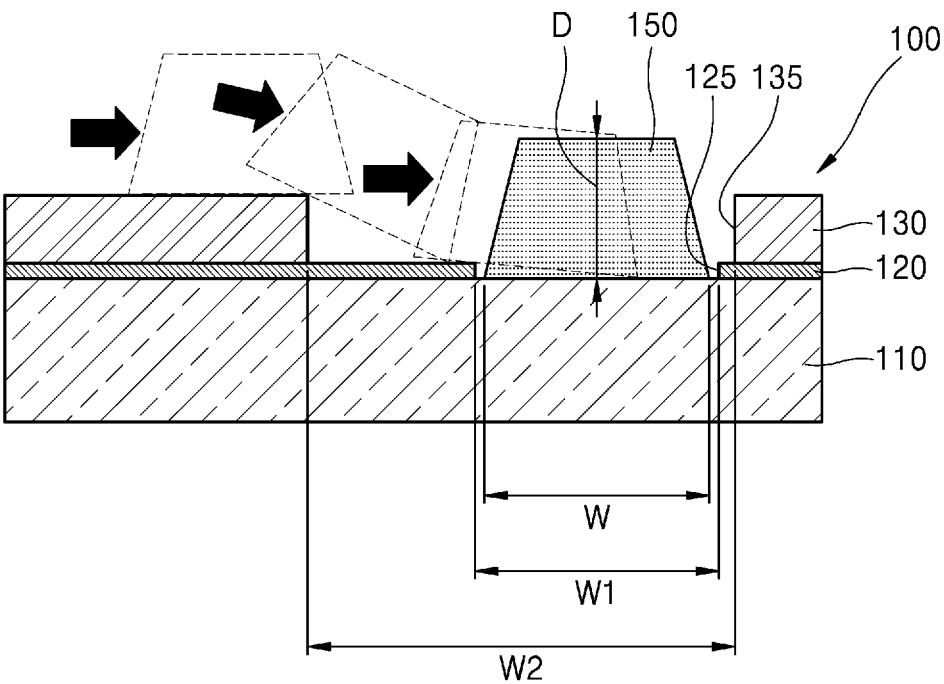
FIG. 3 is a view illustrating a process of transferring a semiconductor device to the semiconductor device transfer structure shown in FIG. 1.

FIG. 3 illustrates a state in which the semiconductor device 150 is aligned with the semiconductor device transfer structure 100.

The semiconductor device 150 is provided on the semiconductor device transfer structure 100, and the semiconductor device 150 slides into the groove 135 through a process of pushing the semiconductor device 150 into the groove 135, the semiconductor device 150 may be seated in the trap 125 that is deeper than the groove 135 while moving into the groove 135. The trap 125 may have a shape similar to a cross-section (e.g., a horizontal cross-section) of the semiconductor device 150 and a size slightly greater than a cross-sectional area of a lower surface of the semiconductor device 150 so that the semiconductor device 150 may be seated therein. For example, when a width of the trap 125 is W1 and a width of the groove 135 is W2, the trap 125 may have a width W1 that is less than the width W2 of the groove 135. In addition, when a maximum width of the lower surface of the semiconductor device 150 is W, the trap 125 may have a width W1 greater than W and less than W2. The trap 125 may have, for example, the width W1 greater than W and less than or equal to 1.2 times W. The width W2 of the groove 135 may be less than twice the width W of the semiconductor device 150 so that two or more semiconductor devices 150 do not enter the groove 135.

Referring to FIGS. 2 and 3, when a thickness of the semiconductor device 150 is D, the depth D2 of the groove 135 may have a range of 0.5D≤D2<D. A lower limit depth of the groove 135 has a depth of 0.5 times the thickness D of the semiconductor device 150 so that the semiconductor device 150 does not enter the groove 135 and escape easily, and an upper limit depth of the groove 135 may be less than the thickness D of the semiconductor device 150 so that the semiconductor device 150 may be easily transferred to another driving substrate later. The depth D1 of the trap 125 may have a range of 0.1D≤D1≤0.2D so that the semiconductor device 150 entering the groove 135 is easily located within the trap 125. However, the depth D2 of the groove 135 and the depth D1 of the trap 125 are not limited to the examples above, and may be variously changed according to an embodiment. For example, the depth D1 of the trap 125 may be changed according to the thickness D of the semiconductor device 150 or the depth D2 of the groove 135.

FIG. 1 illustrates an example in which a cross-sectional shape (e.g., a horizontal cross-sectional shape or a plan view when viewed from top) of the groove 135 is rectangular and a cross-sectional shape (e.g., a horizontal cross-sectional shape or a plan view when viewed from top) of the trap 125 is circular. However, shapes of the groove 135 and the trap 125 are not limited thereto, and the groove 135 may have various cross-sectional shapes as long as the groove 135 has a greater cross-sectional area (e.g., horizontal cross-sectional area) than that of the trap 125. The trap 125 may have various cross-sectional shapes that can accommodate the semiconductor device 150 and within a range in which the semiconductor device 150 does not flow much in the trap 125.

The semiconductor device 150 may have a micro size, and the micro size may be 1000 μm or less, or 200 μm or less. The semiconductor device 150 may include, for example, a light emitting diode (LED), a complementary metal-oxide semiconductor (CMOS), a CMOS image sensor (CIS), a vertical-cavity surface-emitting laser (VCSEL), a photo-diode (PD), a memory device, a two-dimensional (2D) material device, or the like. The 2D material may be graphene, transition metal dichalcogenide, or carbon nano tube (CNT).

Figure 4:
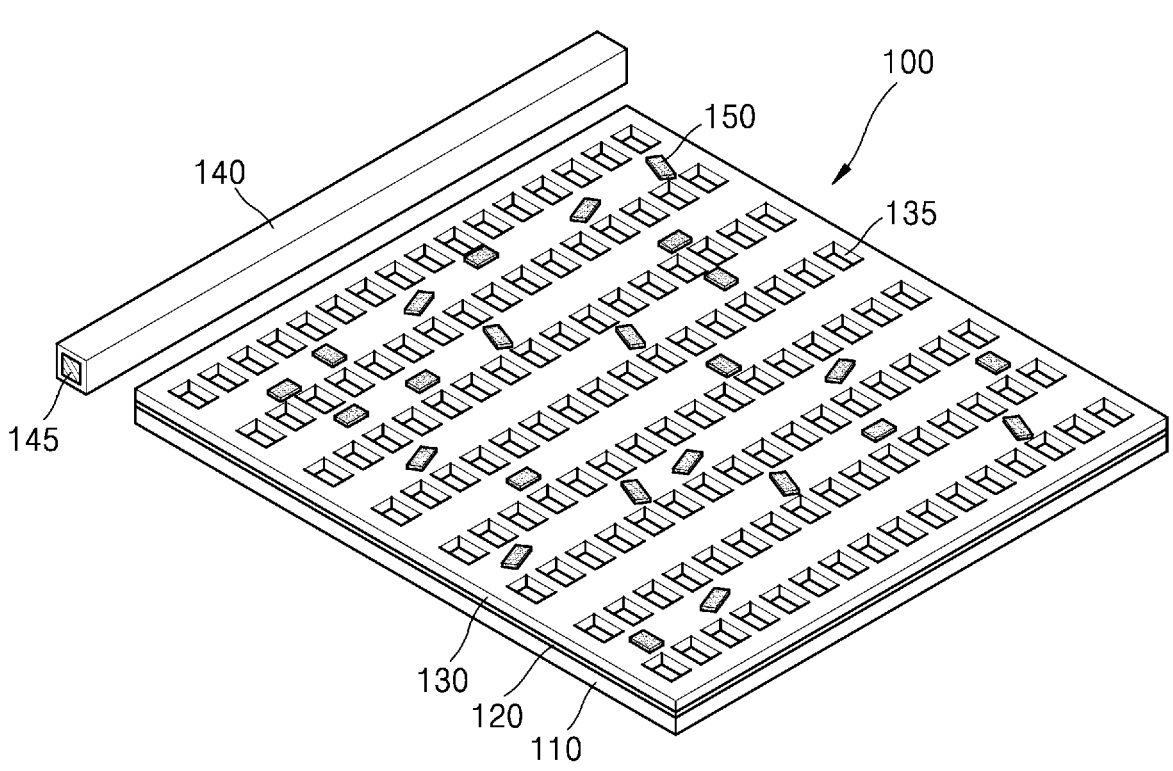
FIG. 4 is a view for explaining a method of transferring a semiconductor device to a semiconductor device transfer structure according to an example embodiment.

In an example embodiment, a pick-and-place method, a stamping method, a fluid self-assembly transfer method, etc. may be used as a method of transferring a semiconductor device. For example, the fluid self-assembly transfer method may be used to align the semiconductor device 150 with the semiconductor device transfer structure 100 by moving the semiconductor device 150 in a fluid with reference to FIG. 4. FIG. 4 is a view for explaining a method of transferring a semiconductor device to a semiconductor device transfer structure according to an example embodiment.

In the fluid self-assembly transfer method, a liquid is supplied to the groove 135, and any type of liquid may be used as long as the liquid does not corrode or damage the semiconductor device 150. The liquid may include, for example, one or a combination of a plurality of groups including water, ethanol, alcohol, polyol, ketone, halocar-bon, acetone, flux, and an organic solvent. The organic solvent may include, for example, isopropyl alcohol (IPA). A usable liquid is not limited thereto, and various modifi-cations may be made.

As a method of supplying a liquid to the groove 135, for example, a spray method, a dispensing method, an inkjet dot method, a method of flowing a liquid through the semicon-ductor device transfer structure 100, etc. may be used in various ways. This is described later below. A supply amount of the liquid may be variously adjusted to fit the groove 135 or to overflow from the groove 135.

Then, a plurality of semiconductor devices 150 may be supplied to the semiconductor device transfer structure 100. The semiconductor device 150 may be directly sprayed onto the semiconductor device transfer structure 100 without another liquid or may be supplied in a state of being included in suspension. As a method of supplying the semiconductor device 150 included in the suspension, a spray method, a dispensing method of dropping a liquid drop by drop, an inkjet dot method of discharging a liquid like a printing method, a method of flowing suspension into the semicon-ductor device transfer structure 100, and the like may be used in various ways.

Then, the transfer layer 130 of the semiconductor device transfer structure 100 is scanned with an absorber 140 capable of absorbing a liquid. The absorber 140 may include a material capable of absorbing a liquid, and its shape or structure is not limited. The absorber 140 may include, for example, fabric, tissue, polyester fiber, paper, or a wiper. The absorber 140 may be used alone without other auxiliary devices, but is not limited thereto, and may be coupled to a support 145 for convenient scanning of the transfer layer 130. The support 145 may have various shapes and struc-tures suitable for scanning the transfer layer 130. The support 145 may have the form of, for example, a rod, a blade, a plate, or a wiper. The absorber 140 may be provided on one side of the support 145 or may surround the support 145.

The absorber 140 may scan the transfer layer 130 while pressing the transfer layer 130 with an appropriate pressure. Scanning may include absorbing a liquid as the absorber 140 contacts the transfer layer 130 and passes through a plurality of grooves 135. Scanning may be performed in various ways, such as, for example, a sliding method, a rotating method, a translating motion method, a reciprocating motion method, a rolling method, a spinning method, and/or a rubbing method of the absorber 140, and may include both a regular method and an irregular method. Scanning may be performed by moving the semiconductor device transfer structure 100 instead of moving the absorber 140, and scanning of the semiconductor device transfer structure 100 may be performed in a manner such as sliding, rotating, translational reciprocating, rolling, spinning, and/or rubbing. However, scanning may be performed by cooperation of the absorber 140 and the semiconductor device transfer struc-ture 100.

Although the fluid self-assembly transfer method has been described as an example of a method of transferring a semiconductor device with reference to FIG. 4, a transfer method of a semiconductor device is not limited thereto.

Figure 5A:
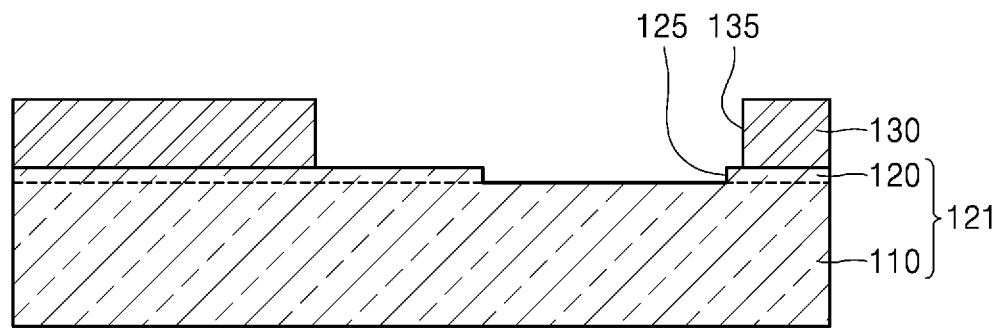
FIGS. 5A, 5B, and 5C are views of a semiconductor device transfer structure according to an example embodiment.
Figure 5B:
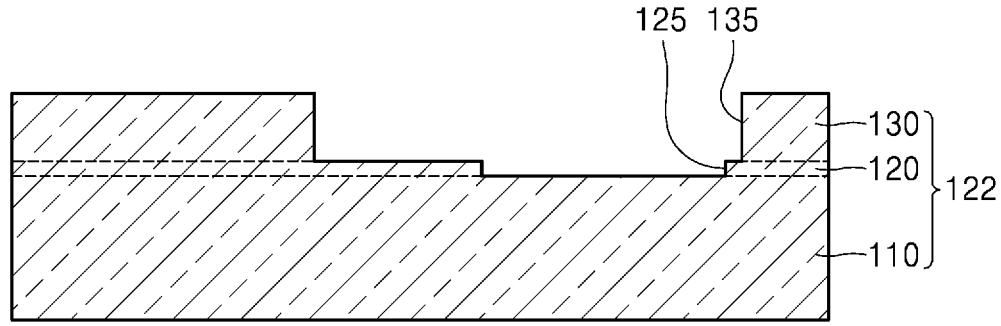
Figure 5C:
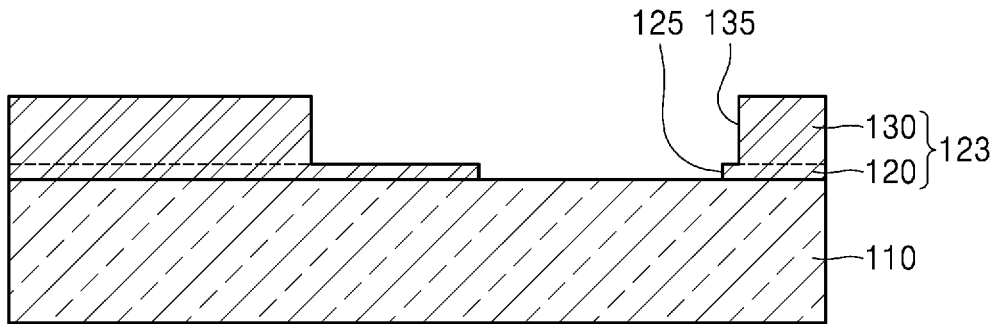

However, as shown in FIG. 5A, the substrate 110 and the alignment layer 120 may be integrally formed. In this case, the trap 125 may be formed in a first substrate 121 including the alignment layer 120 through an etching process. Alter-natively, as shown in FIG. 5B, the substrate 110, the align-ment layer 120, and the transfer layer 130 may be integrally formed. In this case, the trap 125 may be primarily (or in a first order) formed in a second substrate 122 including the alignment layer 120 and the transfer layer 130, and the groove 135 may be formed secondarily (or in a second order). However, the order of forming the trap 125 and the groove 135 is not limited thereto. Alternatively, as shown in FIG. 5C, the alignment layer 120 and the transfer layer 130 may be integrally formed. In this case, a third substrate 123 including the alignment layer 120 and the transfer layer 130 may be deposited on the substrate 110, the trap 125 may be formed primarily, and the groove 135 may be formed secondarily. However, the order of forming the trap 125 and the groove 135 is not limited thereto.

Figure 6:
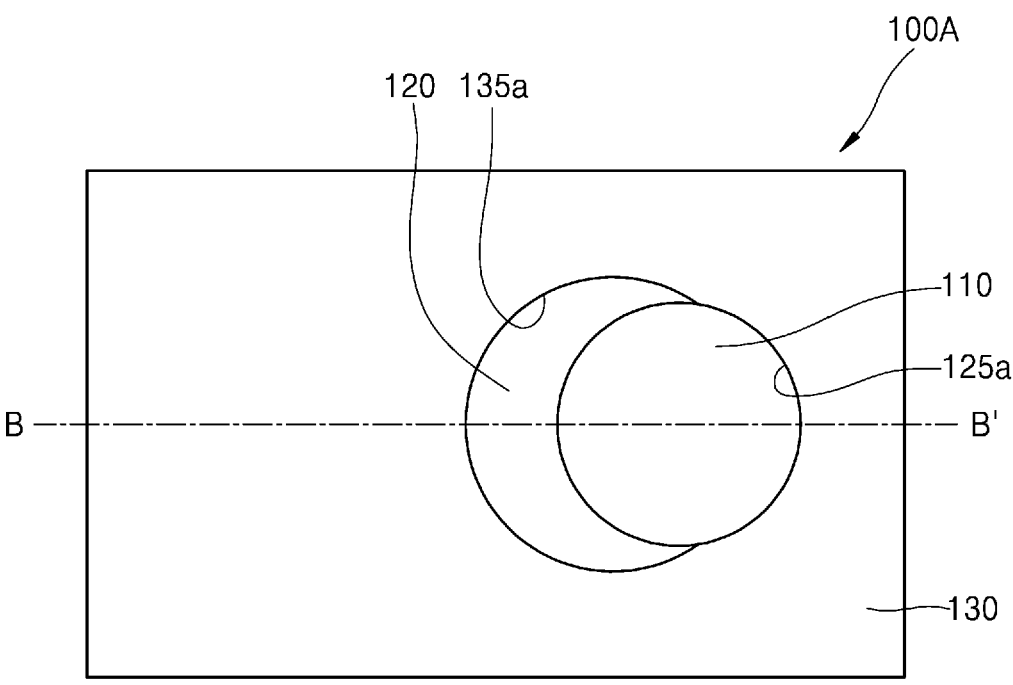
FIG. 6 is a plan view of a semiconductor device transfer structure according to an example embodiment.
Figure 7:
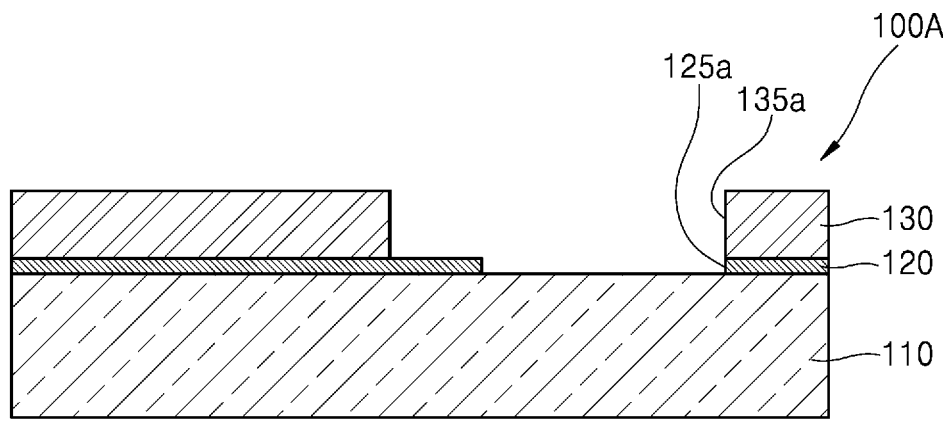
FIG. 7 is a sectional view of the semiconductor device transfer structure taken along line B-B' of FIG. 6.

FIG. 6 is a plan view of a semiconductor device transfer structure according to another example embodiment, and FIG. 7 is a cross-sectional view of the semiconductor device transfer structure taken along line B-B' of FIG. 6. In FIGS. 6 and 7, components denoted by the same reference numer-als as those of FIGS. 1 and 2 are substantially the same as those described with reference to FIGS. 1 and 2, and thus, a detailed description thereof is omitted. In a semiconductor device transfer structure 100A, a trap 125a may be deviated from the center of a groove 135a to one side. In addition, one end of the trap 125a may be arranged to coincide with one end of the groove 135a. The trap 125a may have, for example, a circular horizontal cross-sectional shape, and the groove 125a may have a shape overlapping a portion of the circular horizontal cross-sectional shape of the trap 125a.

Figure 8:
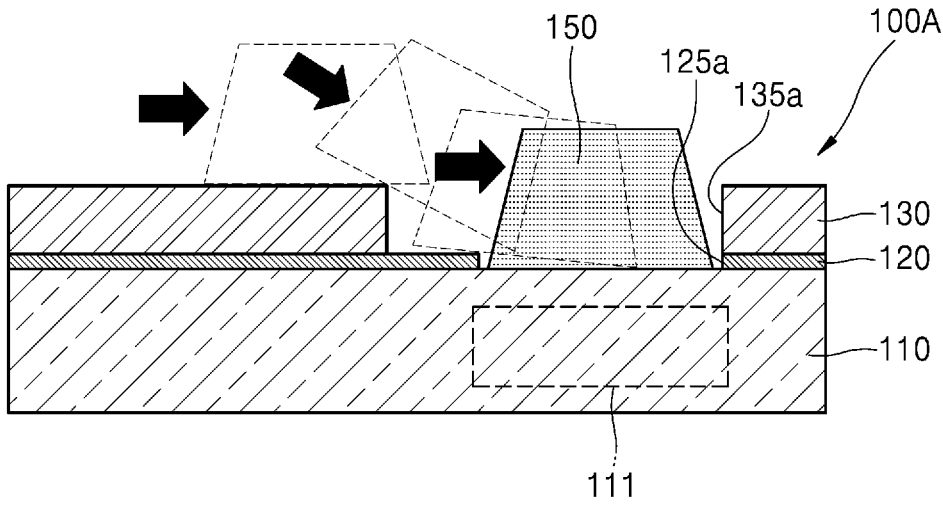
FIG. 8 is a view illustrating an example of a process of transferring a semiconductor device to the semiconductor device transfer structure shown in FIG. 6.

FIG. 8 illustrates an example of a process in which the semiconductor device 150 is transferred to the semiconduc-tor device transfer structure 100A. As described above, the semiconductor device 150 may be pushed into the groove 135a through a scanning process, and in the groove 135a, may move in a scanning direction to be seated in the trap 125a. As such, the trap 125a may be arranged to be biased in the scanning direction of the semiconductor device 150 in the groove 135a. The substrate 110 may be a driving substrate including a circuit 111 for driving the semiconductor device 150. When the substrate 110 is configured as a driving substrate, the semiconductor device 150 may be electrically connected to the circuit 111 of the substrate 110, and a display apparatus may be manufactured by connecting the semiconductor device 150 to the circuit 111. Alternatively, the semiconductor device 150 may further include a circuit layer (not shown) including a circuit for driving the semiconductor device 150 on the transfer layer 130. Alternatively, the display apparatus may be manufactured by retransferring the semiconductor device 150 to another driving substrate.

In the semiconductor device structures 100 and 100A according to example embodiments, when the grooves 135 and 135a have a greater size than that of the semiconductor device 150 so that the semiconductor device 150 flows in the grooves 135 and 135a, the traps 125 and 125a may allow the semiconductor device 150 to be located at an accurate position without being moved. Thus, when an electrode is coupled to the semiconductor device 150, it is possible to prevent mismatching with the electrode according to the flow of the semiconductor device 150.

Figure 9A:
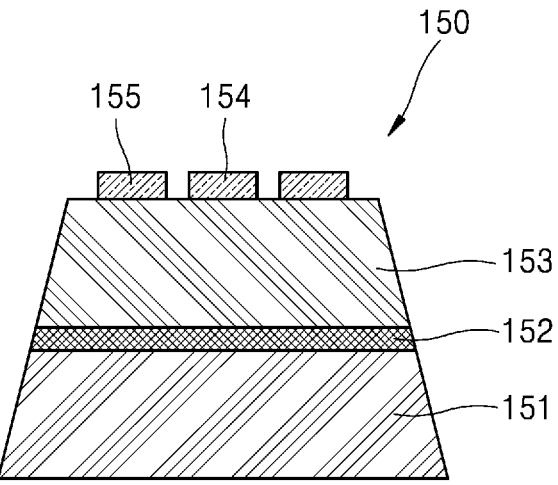
FIG. 9A is a view of an example of a semiconductor device having a horizontal electrode structure.
Figure 9B:
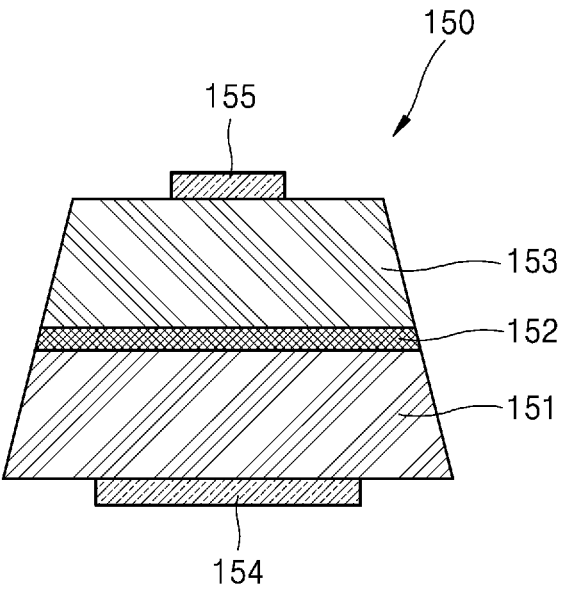
FIG. 9B is a view of an example of a semiconductor device having a vertical electrode structure.

FIGS. 9A and 9B show examples of a semiconductor device.

Referring to FIG. 9A, the semiconductor device 150 may include a first-type semiconductor layer 151, an active layer 152, and a second-type semiconductor layer 153. The first-type semiconductor layer 151 may be an n-type semiconductor layer, and the second-type semiconductor layer 153 may be a p-type semiconductor layer. Alternatively, it is also possible to configure the first-type and second-type semiconductor layers 151, 153 vice versa. The first-type semiconductor layer 151 may be an n-type GaN layer, and the second-type semiconductor layer 153 may be a p-type GaN layer. The active layer 152 may have, for example, a quantum well structure or a multi-quantum well structure. A first electrode 154 and a second electrode 155 may be provided on the second-type semiconductor layer 153. FIG. 9A illustrates a semiconductor device employing a horizontal electrode structure.

FIG. 9B illustrates a semiconductor device employing a vertical electrode structure in which the first electrode 154 is provided on the first-type semiconductor layer 151 and the second electrode 155 is provided on the second-type semiconductor layer 153. A semiconductor device transfer structure according to an example embodiment may transfer a semiconductor device having a horizontal electrode structure or a semiconductor device having a vertical electrode structure.

Figure 10:
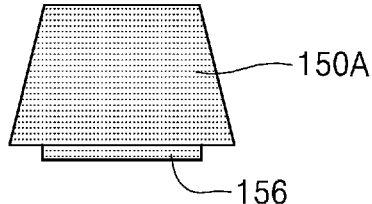
FIG. 10 is a view of an example in which a protrusion is formed in a semiconductor device according to an example embodiment.
Figure 11:
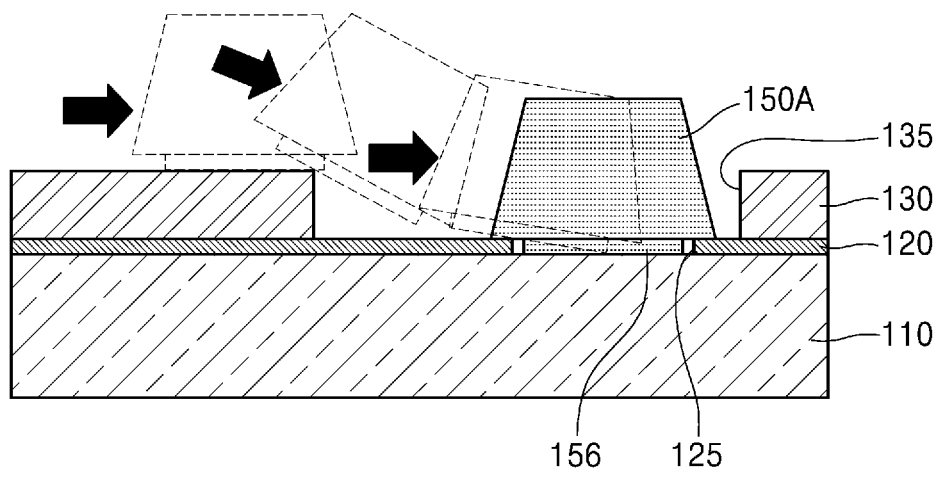
FIG. 11 is a view illustrating a process of transferring the semiconductor device of FIG. 10 to a semiconductor device transfer structure according to an example embodiment.

FIG. 10 illustrates an example in which a semiconductor device includes a protrusion. A semiconductor device 150A may further include a protrusion 156. The protrusion 156 may be formed on a first surface of the semiconductor device 150A to have a smaller size (e.g., smaller cross-sectional area size) than the corresponding first surface. Referring to FIG. 11, when the semiconductor device 150A is transferred, the protrusion 156 may be inserted into the trap 125a of the semiconductor device transfer structure. The protrusion 156 may have various shapes (e.g., plan view shapes), and, for example, the shape of the protrusion 156 may vary according to the type of semiconductor device for each color. When preparing a red semiconductor device, a green semiconductor device, and a blue semiconductor device to implement a color image, the red semiconductor device may include the protrusion 156 having a first shape, the green semiconductor device may include the protrusion 156 having a second shape, and the blue semiconductor device may include the protrusion 156 having a third shape. For example, the red semiconductor device may include a circular protrusion 156, the green semiconductor device may include a rectangular protrusion 156, and the blue semiconductor device may include a pentagonal protrusion 156. In addition, the trap 125 may have the same shape (e.g., same plan view shape) as that of the protrusion 156 corresponding to each color. In this way, a semiconductor device for each color may be transferred.

Figure 12:
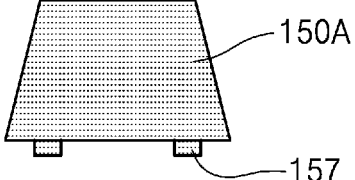
FIGS. 12 and 13 are views of an example in which a protrusion of a ring structure is formed in a semiconductor device.
Figure 13:
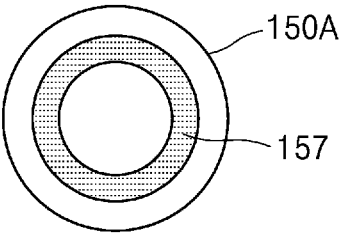
Figure 14:
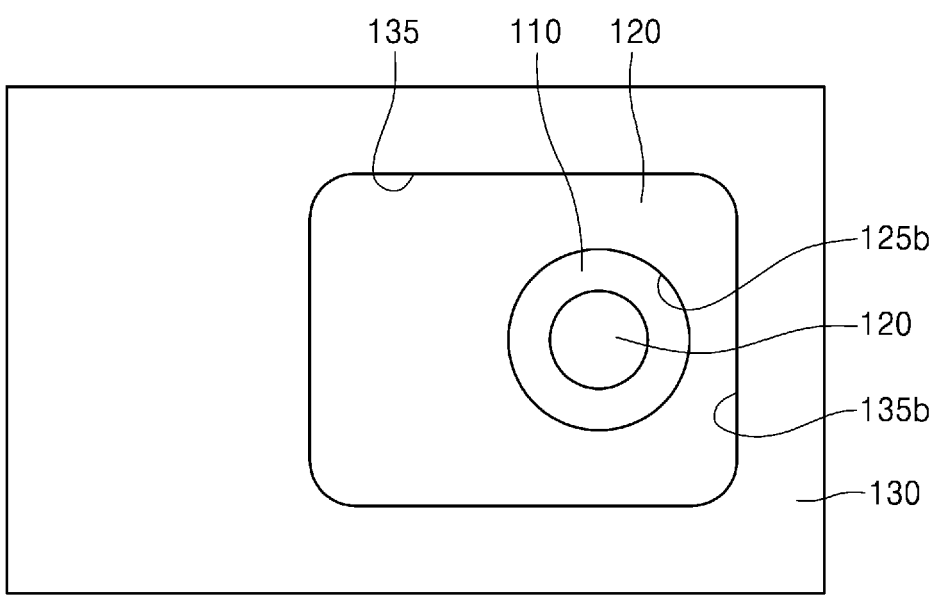
FIG. 14 is a plan view of a semiconductor device transfer structure including a trap corresponding to the semiconductor device shown in FIGS. 12 and 13.

FIGS. 12 and 13 illustrate another example in which a semiconductor device includes a protrusion. FIG. 13 shows a side view of the semiconductor device 150A and FIG. 14 shows a horizontal cross-sectional view of the semiconductor device 150A. The semiconductor device 150A may further include a protrusion 157. The protrusion 157 may have a ring-shaped structure. Referring to FIG. 14, a trap 125b may have a ring-shaped structure corresponding to the shape of the protrusion 157. A groove 135b has a substantially rectangular shape, but is not limited thereto.

Figure 15:
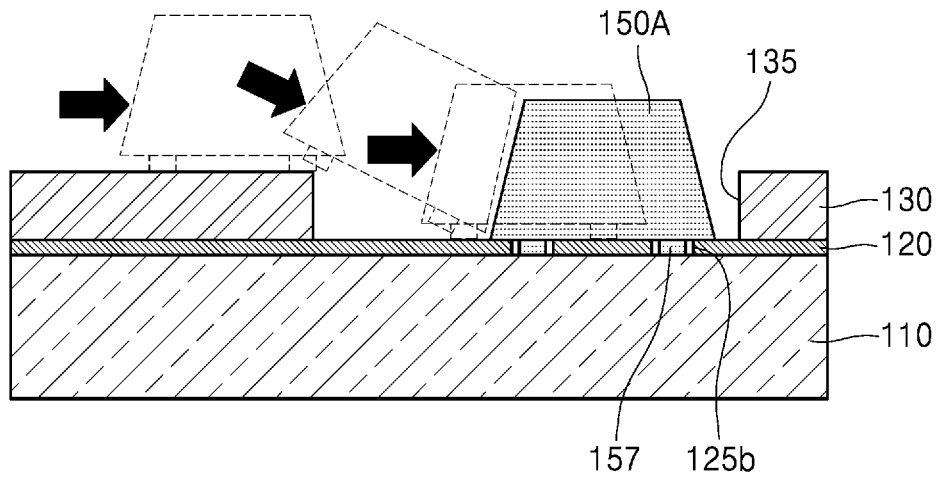
FIG. 15 is a view illustrating a process of transferring a semiconductor device to the semiconductor device transfer structure shown in FIG. 13.

FIG. 14 is a plan view of a semiconductor device transfer structure including a trap corresponding to the semiconductor device shown in FIGS. 12 and 13. FIG. 15 is a view illustrating a process of transferring a semiconductor device to the semiconductor device transfer structure shown in FIG. 13. Referring to FIGS. 14 and 15, when the semiconductor device 150A is transferred, the protrusion 157 may be inserted into the trap 125b of a semiconductor device transfer structure. In addition, the shapes of the protrusion 157 and the trap 125b may vary. On the other hand, the protrusion 157 may also be configured as an electrode. That is, when the protrusion 157 is formed of a metal, the protrusion 157 may also be used as an electrode.

Figure 16:
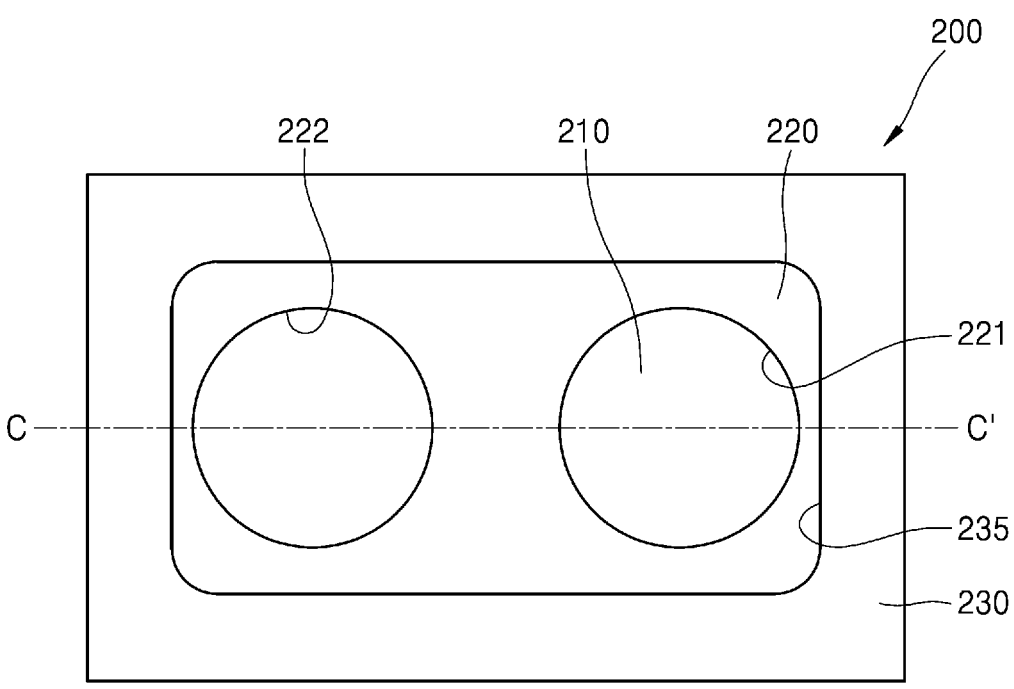
FIG. 16 is a plan view of a semiconductor device transfer structure according to an example embodiment.
Figure 17:
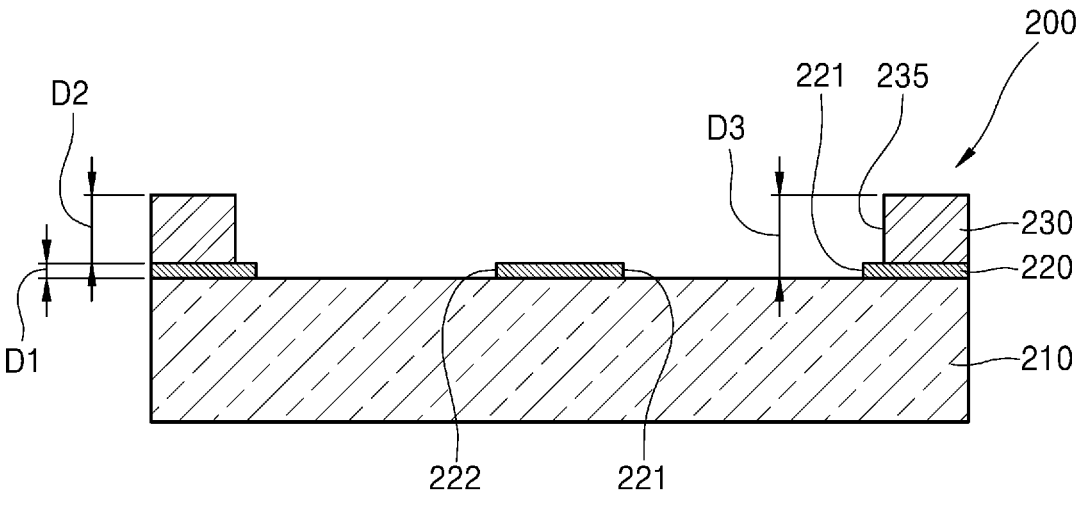
FIG. 17 is a cross-sectional view of the semiconductor device transfer structure taken along line C-C' of FIG. 16.

FIG. 16 is a plan view of a semiconductor device transfer structure according to another embodiment, and FIG. 17 is a cross-sectional view of the semiconductor device transfer structure taken along line C-C' of FIG. 16.

A semiconductor device transfer structure 200 may include a substrate 210, an alignment layer 220 provided on the substrate 210, and a transfer layer 230 provided on the alignment layer 220. The alignment layer 220 may include a first trap 221 and a second trap 222, wherein the first trap 221 and the second trap 222 may be apart from each other. The transfer layer 230 may include a groove 235, and the groove 235 may overlap the first trap 221 and the second trap 222 to include the first trap 221 and the second trap 222 therein. In the present embodiment, two semiconductor devices may be transferred to one groove 235. Although an example in which two traps are provided is shown, three or more traps may be provided.

In FIG. 17, the depth D1 of the first trap 221 and the second trap 222 and the depth D2 of the groove 235 may be in the range that is substantially the same as those described with reference to FIG. 2, and thus, detailed descriptions thereof are omitted.

Figure 18:
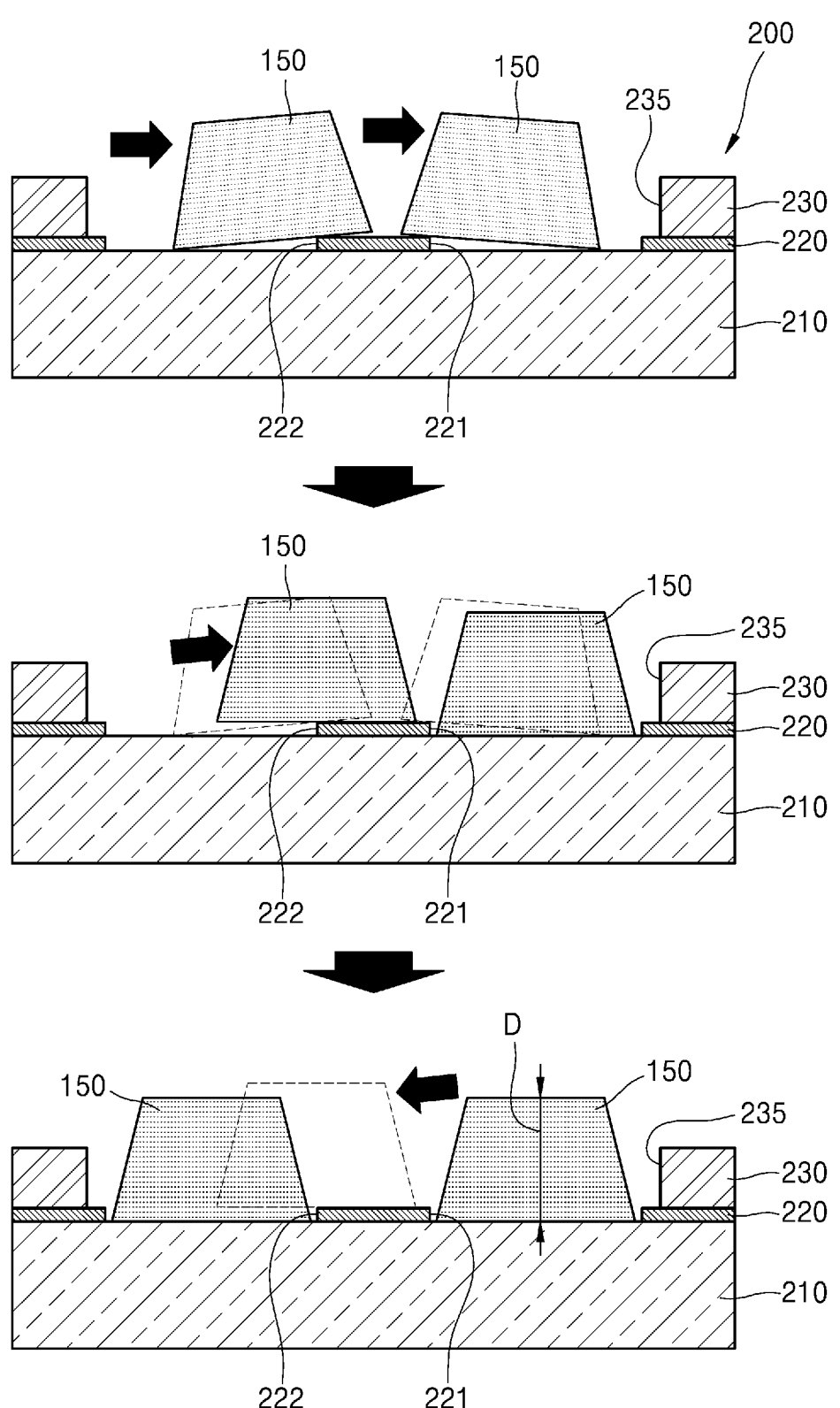
FIG. 18 is a view illustrating a process of transferring a semiconductor device to the semiconductor device transfer structure shown in FIG. 16.

FIG. 18 is a view illustrating a process of transferring the semiconductor device 150 to the semiconductor device transfer structure 200 shown in FIG. 16. When the semiconductor device 150 is supplied to the semiconductor device transfer structure 200 and scanned or pushed in, the semiconductor device 150 may enter the groove 235, the semiconductor device 150 may flow in the groove 235 and be seated on the first trap 221, and when the scanning direction is changed, another semiconductor device 150 may be seated on the second trap 222. As such, when a plurality of semiconductor devices 150 are transferred to one groove 235, the amount of light emitted from the semiconductor devices 150 may be increased, and even when only one semiconductor device 150 enters the groove 235, an error may not occur, and thus a repair rate may be reduced.

Figure 19:
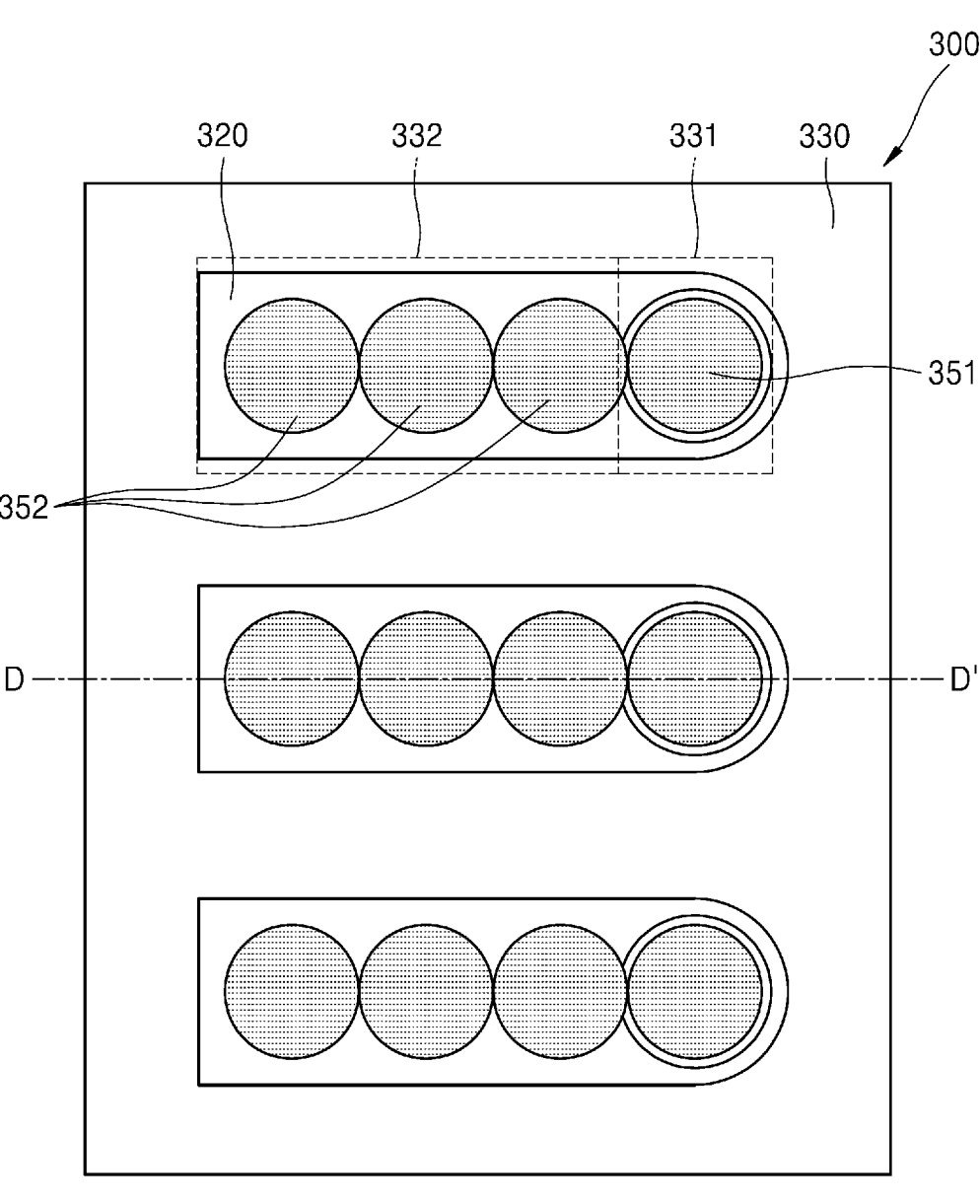
FIG. 19 is a plan view of a semiconductor device transfer structure according to an example embodiment.
Figure 20:
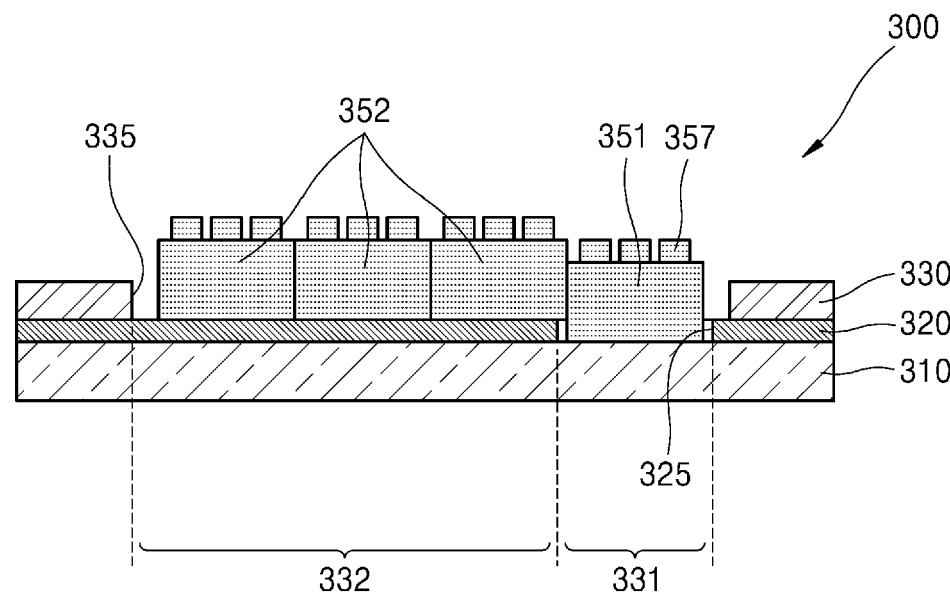
FIG. 20 is a sectional view of the semiconductor device transfer structure taken along line D-D' of FIG. 19.

FIG. 19 is a plan view of a semiconductor device transfer structure according to another example embodiment, and FIG. 20 is a cross-sectional view of the semiconductor device transfer structure taken along line D-D' of FIG. 19.

A semiconductor device transfer structure 300 may include a substrate 310, an alignment layer 320 provided on the substrate 310, and a transfer layer 330 provided on the alignment layer 320. The transfer layer 330 may include a groove 335, and the groove 335 may include an area for accommodating a semiconductor device. The semiconductor device may include a transfer semiconductor device 351 to be transferred to a driving substrate 360 (of FIG. 21) of a display apparatus, which is described later below, and a preliminary semiconductor device 352 to wait for transfer. The transfer semiconductor device 351 and the preliminary semiconductor device 352 may include an electrode 357.

The groove 335 may include a transfer area 331 for accommodating the transfer semiconductor device 351, and a preliminary area 332 in connection with the transfer area 331 and for accommodating the preliminary semiconductor device 352. The preliminary area 332 is connected to the transfer area 331 to allow the preliminary semiconductor device 352 to pass therethrough. The transfer area 331 may have a size for accommodating one or more transfer semiconductor devices 351, and FIG. 19 illustrates an example in which the transfer area 331 has a size for accommodating one transfer semiconductor device 351.

A trap 325 may be provided in an area of the alignment layer 320 corresponding to the transfer area 331. The trap 325 is located at a position deeper than the groove 335, and may have a stepped structure with respect to the groove 335.

The groove 335 may have a straight groove shape having an identical width so that the transfer semiconductor device 351 and the preliminary semiconductor devices 352 may be arranged in a line.

The transfer area 331 may be provided at one end of the groove 335. Because the preliminary semiconductor device 352 is moved to the transfer area 331 through the operation of pushing the preliminary semiconductor device 352 in one direction, the transfer area 331 may be provided at the end of the groove 335. When the preliminary semiconductor device 352 moves to the transfer area 331, the preliminary semiconductor device 352 may be seated in the trap 325 of the transfer area 331 and may be ready to be transferred to an accurate position.

Figure 21:
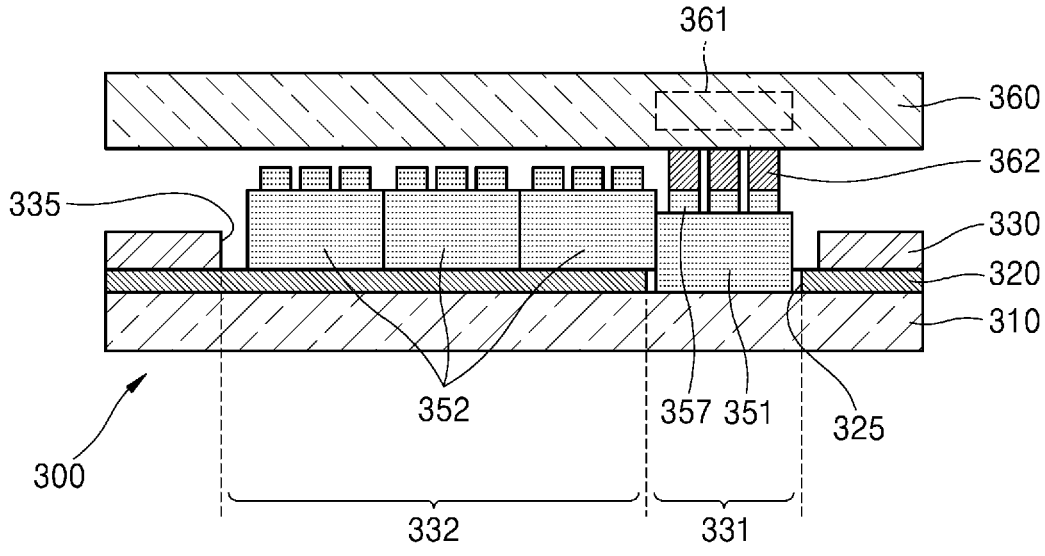
FIGS. 21, 22, and 23 are views illustrating an example of a process of transferring a semiconductor device from the semiconductor device transfer structure shown in FIG. 19 to a driving substrate.
Figure 22:
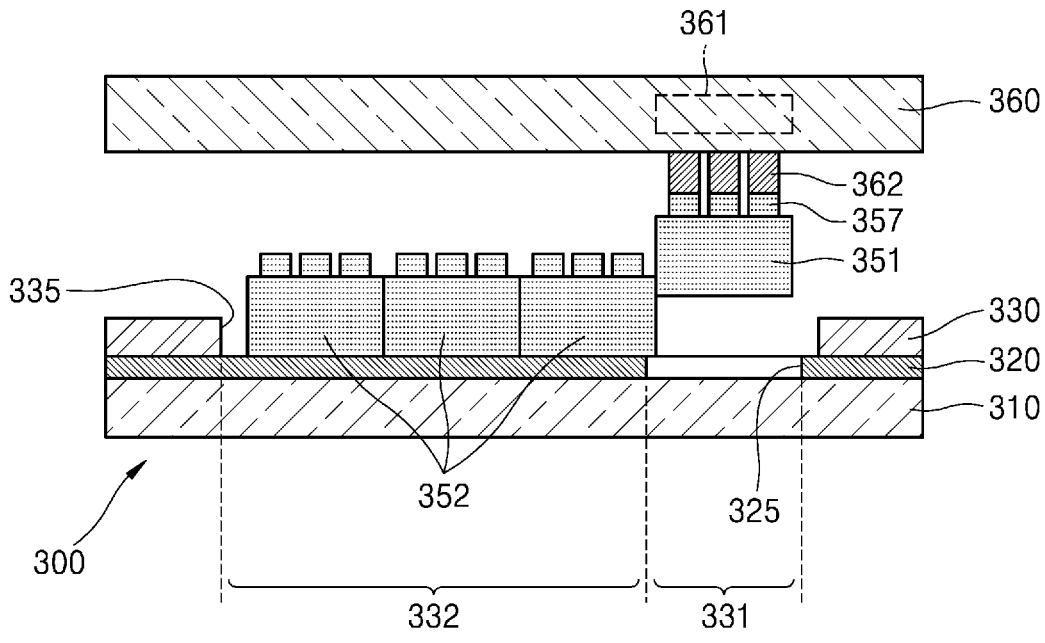
Figure 23:
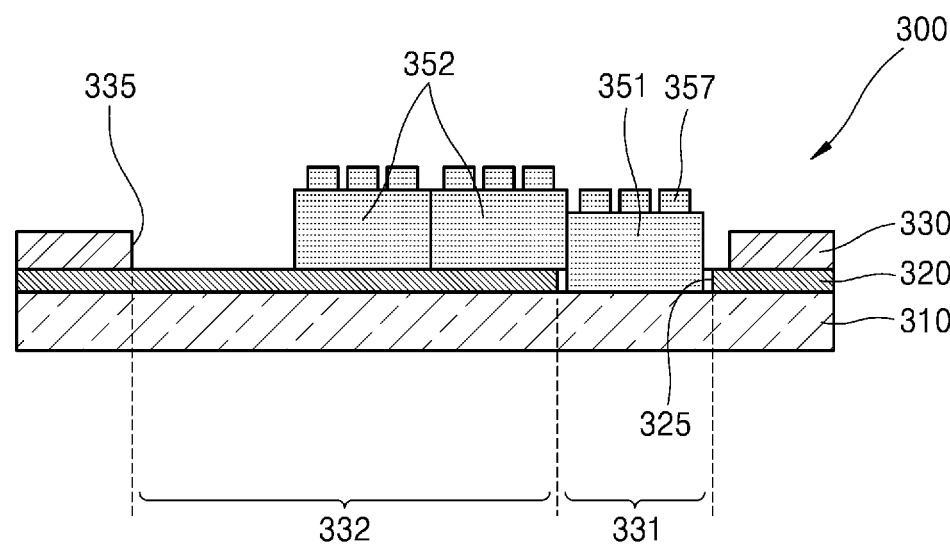

FIGS. 21, 22, and 23 are views illustrating an example of a process of transferring a semiconductor device from the semiconductor device transfer structure shown in FIG. 19 to a driving substrate.

Referring to FIG. 21, the transfer semiconductor device 351 arranged in the transfer area 331 may be transferred to the driving substrate 360. The driving substrate 360 may include a driving circuit 361 for driving the transfer semiconductor device 351. Reference numeral 362 may denote an electrode pad. The driving substrate 360 may be arranged to face the semiconductor device transfer structure 300, and the electrode pad 362 may be aligned to meet the electrode 357 of the corresponding transfer semiconductor device 351.

Referring to FIG. 22, when the electrode 357 is bonded to the corresponding electrode pad 362 and the driving substrate 360 is moved, the transfer semiconductor device 351 may be bonded and transferred to a corresponding pixel area of the driving substrate 360. When the transfer semiconductor device 351 is bonded and transferred to the driving substrate 360, the transfer area 331 of the groove 335 becomes an empty space.

Referring to FIG. 23, by moving the preliminary semiconductor device 352 to the empty transfer area 331 of the groove 335, the preliminary semiconductor device 352 may be located in the trap 325 of the transfer area 331. When the preliminary semiconductor device 352 is moved to the transfer area 331, the remaining preliminary semiconductor devices 352 are all shifted in one direction and one of the preliminary semiconductor devices 352 may be moved to the trap 325 of the transfer area 331.

As described above, another preliminary semiconductor device 352 may be moved to the transfer area 331, and then the preliminary semiconductor device 352 may be transferred to another driving substrate. By repeating this method, semiconductor devices may be transferred to another driving substrate a plurality of times until all of the preliminary semiconductor devices 352 are exhausted. In this manner, the total process time may be reduced and a transfer yield may be increased.

Figure 24:
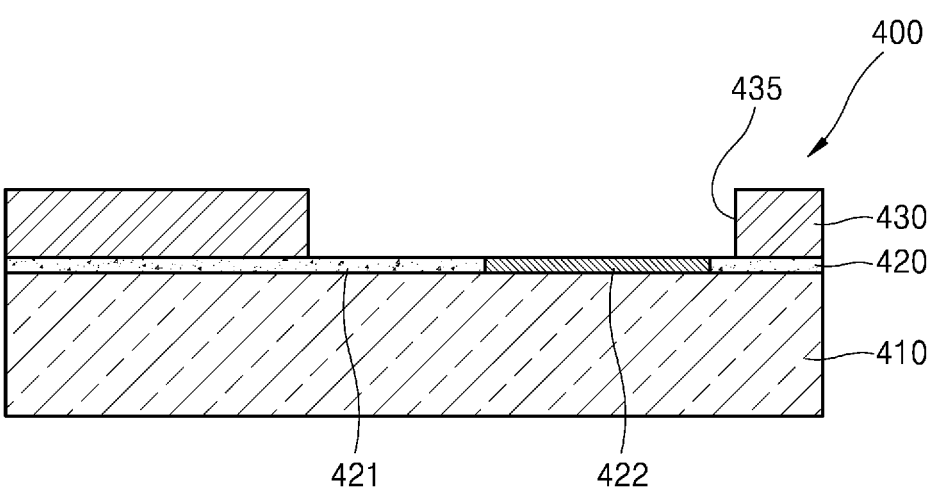
FIG. 24 is a cross-sectional view of a semiconductor device electronic structure according to an example embodiment.
Figure 25:
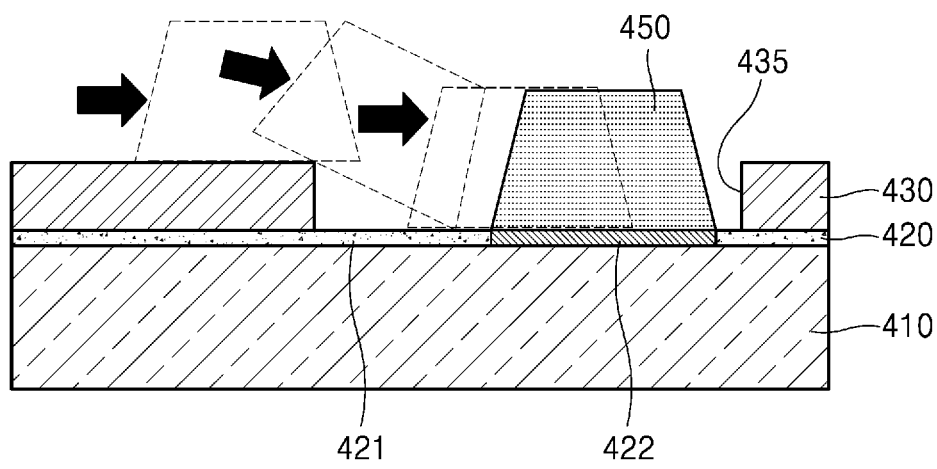
FIG. 25 is a view illustrating a process of transferring a semiconductor device to the semiconductor device transfer structure shown in FIG. 24.

FIGS. 24 and 25 illustrate a semiconductor device transfer structure according to another example embodiment.

A semiconductor device transfer structure 400 may include a substrate 410, an alignment layer 420 provided on the substrate 410, and a transfer layer 430 provided on the alignment layer 420.

The alignment layer 420 may include a first area 421 and a second area 422 having a surface adhesion greater than that of the first area 421 to seat a semiconductor device 450 in the second area 422. The transfer layer 430 may include a groove 435, and the groove 435 may be located to overlap at least the second area 422.

For example, the second area 422 may be configured to have a smaller surface roughness than that of the first area 421 so that the second area 422 has a greater surface adhesion than that of the first area 421, and/or the first area 421 may include a hydrophobic material, and the second area 422 may include a hydrophilic material. Because the second area 422 has a greater surface adhesion than that of the first area 421, the semiconductor device 450 entering the groove 435 may be seated in the second area 422 while moving within the groove 435.

In addition, the second area 422 may have higher surface energy than that of the first area 421. Higher surface energy may promote higher wettability or the ability to absorb a material. The surface energy refers to a sum of all binding energies of the remaining portion of the outermost atom so that the remaining portion cannot bond with inner atoms and may bond with other external atoms. The surface energy may be proportional to the surface adhesion. The surface energies of the first area 421 and the second area 422 may be different by performing selective surface treatment. For example, a method of selectively irradiating ultraviolet rays to an insulating film to change the insulating film into a hydrophilic state may be used to form the first area 421 and the second area 422, or a method of making a micro-mold having a micro-pattern formed on the surface and contacting the micro-mold with a substrate for a certain period of time and a certain number of times to form a hydrophobic area with low surface energy of a contact surface may be used.

Figure 26:
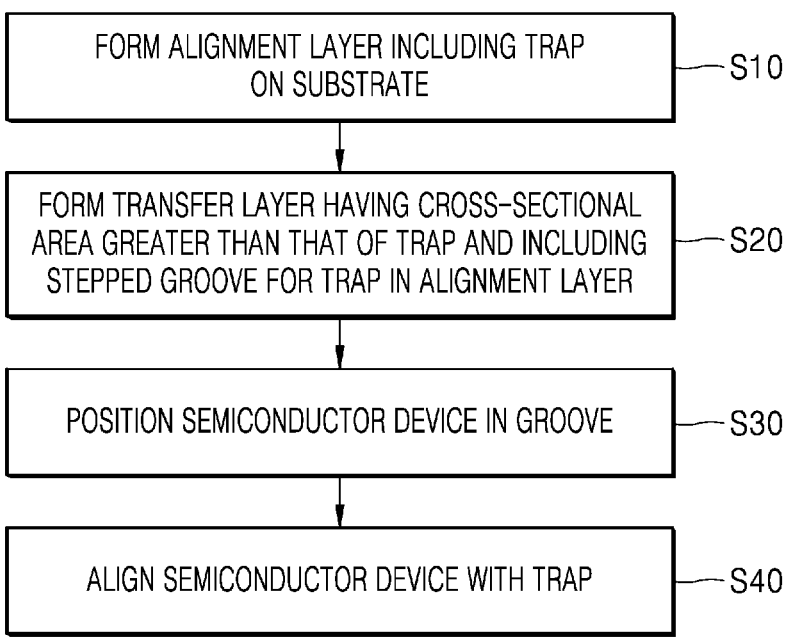
FIG. 26 is a view for explaining a method of manufacturing a display apparatus, according to an example embodiment.

FIG. 26 is a view for explaining a method of manufacturing a display apparatus according to an example embodiment. The method of manufacturing a display apparatus is described with reference to FIGS. 1 to 3, as an example.

Referring to FIG. 26, in operation S10, the alignment layer 120 including the trap 125 is formed on the substrate 110. The trap 125 may be configured to seat the semiconductor device 150. In operation S20, the transfer layer 130 having a cross-sectional area greater than that of the trap 125 and including the stepped groove 135 for the trap 125 is formed in the alignment layer 120. In operation S30, the semiconductor device 150 is supplied to the semiconductor device transfer structure 100 and moved to be located in the groove 135. In operation S40, the semiconductor device 150 is moved and aligned with the trap 125.

Because the trap 125 is located deeper than the groove 135 and has a shape and size similar to those of the semiconductor device 150, the semiconductor device 150 may be aligned in a correct position. The groove 135 may have a size capable of accommodating one or more semiconductor devices 150, and the size of the groove 135 may be changed according to the number of traps 125.

According to the method of manufacturing a display apparatus according to an example embodiment, the semiconductor devices 150 may be precisely aligned with the trap 125, and accordingly, may operate according to a signal of a driving circuit after being accurately and electrically connected to a wire of the driving circuit. In order for an electronic device including semiconductor devices to operate stably, the semiconductor devices need to be aligned at a certain position of a transfer structure. When the semiconductor devices are not aligned in a correct position, a problem may occur in electrical connection and malfunction may occur. The method of manufacturing a display apparatus, according to an example embodiment, may increase alignment accuracy of semiconductor devices. In addition, it is possible to prevent the semiconductor devices from being deviated from an alignment position due to a difference in depth between a groove and a trap, and it is possible to reduce electrical connection defects.

Figure 27:
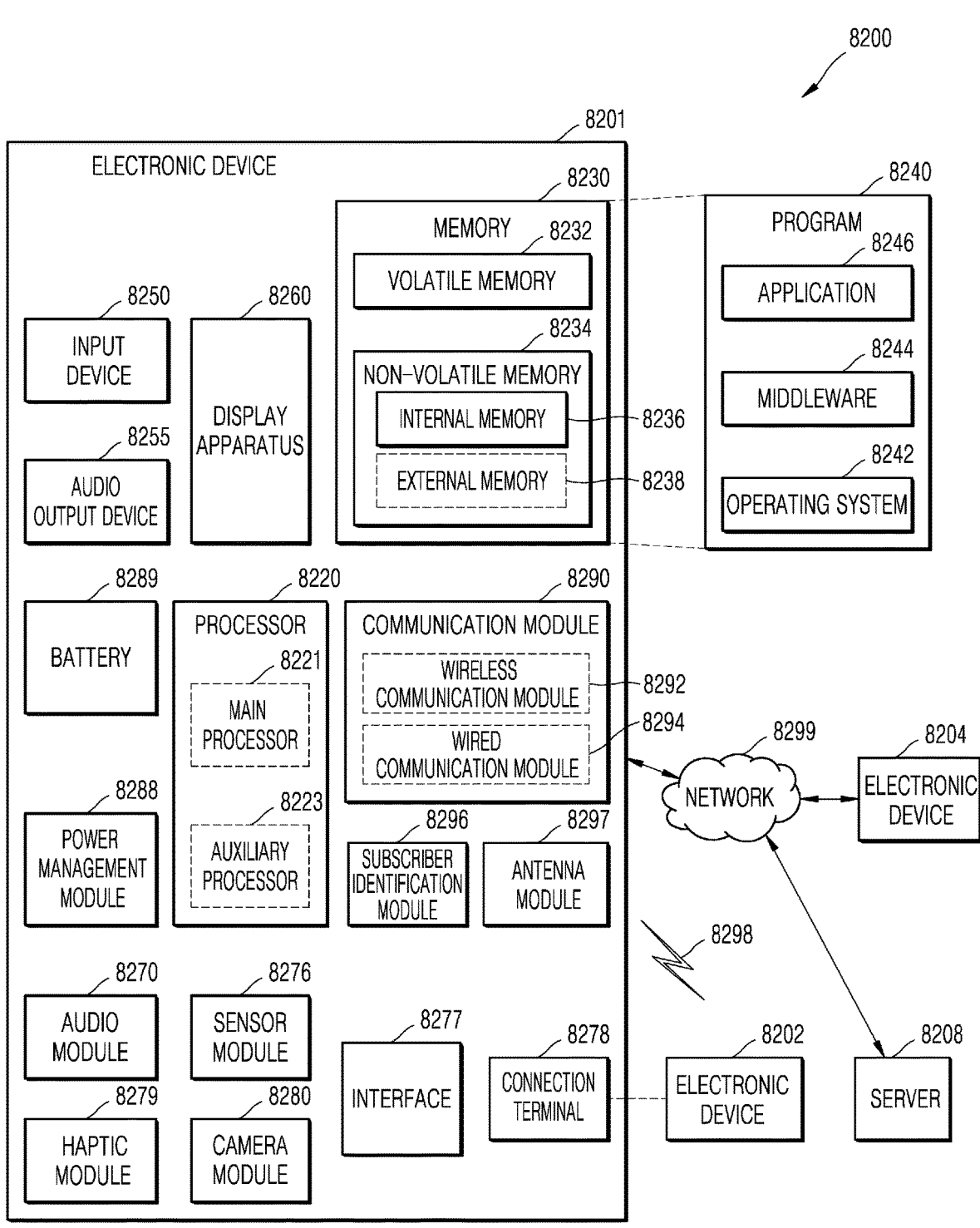
FIG. 27 is a schematic block diagram of an electronic device according to an example embodiment.

FIG. 27 is a block diagram of an electronic device including a display apparatus according to an example embodiment.

Referring to FIG. 27, an electronic device 8201 may be provided in a network environment 8200. In the network environment 8200, the electronic device 8201 may communicate with another electronic device 8202 through a first network 8298 (a near-field wireless communication network, etc.), or may communicate with another electronic device 8204 and/or a server 8208 through a second network 8299 (a telecommunications network, etc.). The electronic device 8201 may communicate with the another electronic device 8204 through the server 8208. The electronic device 8201 may include a processor 8220, a memory 8230, an input device 8250, an audio output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted, or other components may be added. Some of these components may be implemented in one integrated circuit. For example, the sensor module 8276 (a fingerprint sensor, an iris sensor, an illuminance sensor, etc.) may be implemented by being embedded in the display apparatus 8260 (a display, etc.).

The processor 8220 may execute software (a program 8240, etc.) to control one or more other components (hardware or software components, etc.) of the electronic device 8201 connected to the processor 8220, and may perform a variety of data processing or operations. As a portion of the data processing or operations, the processor 8220 may load instructions and/or data received from other components (the sensor module 8276, the communication module 8290, etc.) into a volatile memory 8232, may process instructions and/or data stored in the volatile memory 8232, and may store result data in a nonvolatile memory 8234. The nonvolatile memory 8234 may include an internal memory 8236 and an external memory 8238. The processor 8220 may include a main processor 8221 (a central processing unit, an application processor, etc.) and an auxiliary processor 8223 (a graphics processing unit, an image signal processor, a sensor hub processor, a communication processor, etc.) that may be operated independently or together. The auxiliary processor 8223 uses less power than the main processor 8221 and may perform specialized functions.

The auxiliary processor 8223 may control functions and/or states related to some (the display apparatus 8260, the sensor module 8276, the communication module 8290, etc.) of the components of the electronic device 8201 on behalf of the main processor 8221 while the main processor 8221 is in an active (e.g., sleep) state or with the main processor 8221 while the main processor 8221 is in an inactive (e.g., application execution) state. The auxiliary processor 8223 (an image signal processor, a communication processor, etc.) may be implemented as a portion of other functionally relevant components (the camera module 8280, the communication module 8290, etc.).

The memory 8230 may store a variety of data required by components (the processor 8220, the sensor module 8276, etc.) of the electronic device 8201. The data may include, for example, software (the program 8240, etc.) and input data and/or output data for commands related thereto. The memory 8230 may include the volatile memory 8232 and/or the nonvolatile memory 8234.

The program 8240 may be stored as software in the memory 8230, and may include an operating system 8242, middleware 8244, and/or an application 8246.

The input device 8250 may receive commands and/or data to be used for the components (the processor 8220, etc.) of the electronic device 8201 from the outside (a user, etc.) of the electronic device 8201. The input device 8250 may include a remote controller, microphone, mouse, keyboard, and/or digital pen (a stylus pen, etc.).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a portion of the speaker or may be implemented as a separate device.

The display apparatus 8260 may visually provide information to the outside of the electronic device 8201. The display apparatus 8260 may include a display, a hologram device, or a projector and a control circuit for controlling the devices. The display apparatus 8260 may include a display apparatus manufactured using the transfer structure described with reference to FIGS. 1 to 25. The display apparatus 8260 may include touch circuitry set to sense a touch, and/or sensor circuitry (a pressure sensor, etc.) configured to measure the intensity of force generated by the touch.

The audio module 8270 may convert sound into an electrical signal, or vice versa. The audio module 8270 may obtain sound through the input device 8250, or may output sound through the audio output device 8255 and/or speakers and/or headphones of another electronic device (the another electronic device 8202, etc.) directly or wirelessly connected to the electronic device 8201.

The sensor module 8276 may detect an operating state (power, temperature, etc.) of the electronic device 8201 or an external environmental state (user status, etc.), and may generate an electrical signal and/or a data value corresponding to the detected state. The sensor module 8276 may include a gesture sensor, a gyro sensor, a barometric sensor, a magnetic sensor, an acceleration sensor, a grip sensor, a proximity sensor, a color sensor, an infrared (IR) sensor, a biological sensor, a temperature sensor, a humidity sensor, and/or an illuminance sensor.

The interface 8277 may support one or more designated protocols, which may be used to directly or wirelessly connect the electronic device 8201 with other electronic devices (the another electronic device 8202, etc.). The interface 8277 may include a high definition multimedia interface (HDMI), a universal serial bus (USB) interface, a secure digital (SD) card interface, and/or an audio interface.

A connection terminal 8278 may include a connector through which the electronic device 8201 may be physically connected to other electronic devices (the another electronic device 8202, etc.). The connection terminal 8278 may include an HDMI connector, a USB connector, an SD card connector, and/or an audio connector (a headphone connector, etc.).

The haptic module 8279 may convert electrical signals into a mechanical stimulus (vibration, movement, etc.) or an electrical stimulus that the user may perceive through tactile or motor sensations. The haptic module 8279 may include a motor, a piezoelectric element, and/or an electrical stimulation device.

The camera module 8280 may capture a still image and a moving image. The camera module 8280 may include a lens assembly including one or more lenses, image sensors, image signal processors, and/or flashes. The lens assembly included in the camera module 8280 may collect light emitted from an object to be captured.

The power management module 8288 may manage power supplied to the electronic device 8201. The power management module 8288 may be implemented as a portion of a power management integrated circuit (PMIC).

The battery 8289 may supply power to components of the electronic device 8201. The battery 8289 may include a non-rechargeable primary battery, a rechargeable secondary battery, and/or a fuel cell.

The communication module 8290 may support establishment of a direct (wired) communication channel and/or a wireless communication channel between the electronic device 8201 and other electronic devices (the another electronic device 8202, the another electronic device 8204, the server 8208, etc.), and communication through the established communication channel. The communication module 8290 operates independently of the processor 8220 (an application processor, etc.) and may include one or more communication processors supporting direct communication and/or wireless communication. The communication module 8290 may include a wireless communication module 8292 (a cellular communication module, a short-range wireless communication module, a global navigation satellite system (GNSS), etc.) and/or a wired communication module 8294 (a local area network (LAN) communication module, a power line communication module, etc.). The corresponding communication module among these communication modules may communicate with other electronic devices through the first network 8298 (a local area network such as Bluetooth, WiFi Direct, or Infrared Data Association (IrDA)) or the second network 8299 (a telecommunication network such as a cellular network, the Internet, or computer networks (LAN, WAN, etc.)). These various types of communication modules may be integrated into a single component (a single chip, etc.) or may be implemented as a plurality of separate components (multiple chips). The wireless communication module 8292 may identify and authenticate the electronic device 8201 within a communication network such as the first network 8298 and/or the second network 8299 using subscriber information (an international mobile subscriber identifier (IMSI), etc.) stored in the subscriber identity module 8296.

The antenna module 8297 may transmit and/or receive signals and/or power to and/or from the outside (other electronic devices, etc.). An antenna may include a radiator made of a conductive pattern formed on a substrate (a PCB, etc.). The antenna module 8297 may include one or more antennas. When a plurality of antennas are included, the communication module 8290 may select an antenna suitable for a communication method used in a communication network, such as the first network 8298 and/or the second network 8299, among the plurality of antennas. Signals and/or power may be transmitted or received between the communication module 8290 and other electronic devices through the selected antenna. Other components (RFIC, etc.) besides the antenna may be included as a portion of the antenna module 8297.

Some of the components may be connected to each other and exchange signals (command, data, etc.) through a communication method between peripheral devices (a bus, general purpose input and output (GPIO), a serial peripheral interface (SPI), a mobile industry processor interface (MIPI), etc.).

Commands or data may be transmitted or received between the electronic device 8201 and the another electronic device 8204, which is external, through the server 8208 connected to the second network 8299. The other electronic devices 8202 and 8204 may be the same as or different from the electronic device 8201. All or some of the operations executed in the electronic device 8201 may be executed in one or more of the other electronic devices 8202, 8204, and the server 8208. For example, when the electronic device 8201 needs to perform certain functions or services, the electronic device 8201 may request one or more other electronic devices to perform some or all of the functions or services instead of directly executing the functions or services. One or more other electronic devices that have received the request may execute an additional function or service related to the request, and may transfer a result of the execution to the electronic device 8201. To this end, cloud computing, distributed computing, and/or client-server computing technologies may be used.

Figure 28:
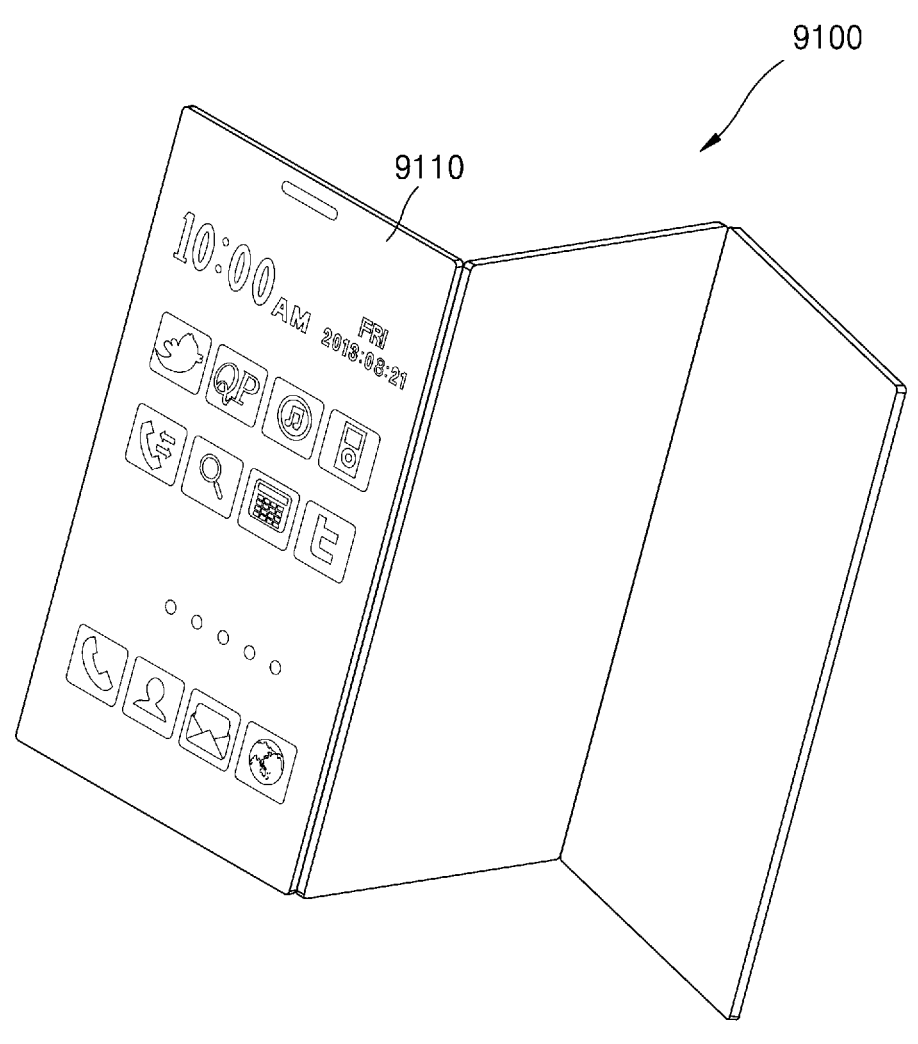
FIG. 28 is a view of an example in which a display apparatus according to an example embodiment is applied to a mobile device.

FIG. 28 is a view of an example in which a display apparatus according to an example embodiment is applied to a mobile device. A mobile device 9100 may include a display apparatus 9110, and the display apparatus 9110 may include display apparatuses manufactured by the manufacturing method described with reference to FIGS. 1 to 26. The display apparatus 9110 may have a foldable structure, for example, a multi-foldable structure.

Figure 29:
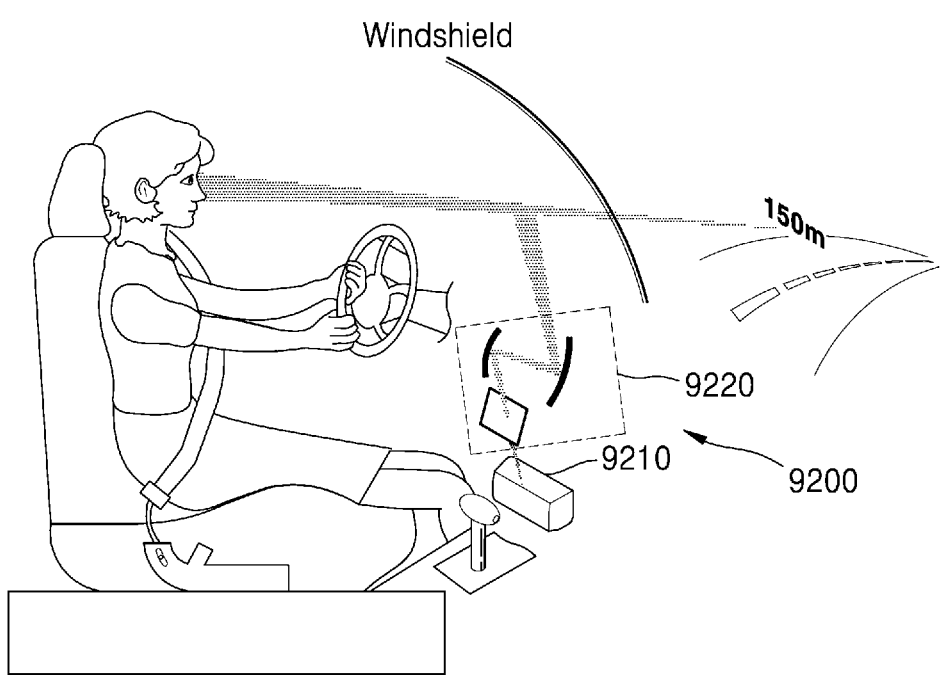
FIG. 29 is a view of an example in which a display apparatus according to an example embodiment is applied to a vehicle display apparatus.

FIG. 29 illustrates an example in which a display apparatus according to an example embodiment is applied to a vehicle. The display apparatus may be a head-up display apparatus 9200 for a vehicle, and may include a display 9210 provided in an area of the vehicle, and an optical path changing member 9220 that converts an optical path so that a driver may view an image generated on the display 9210.

Figure 30:
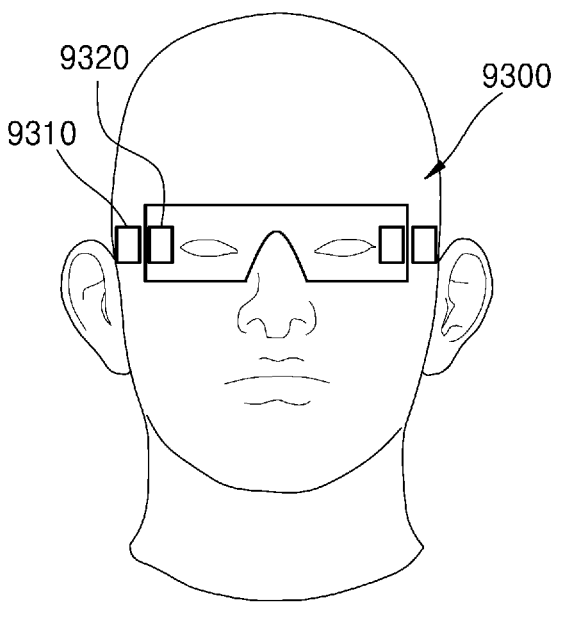
FIG. 30 is a view of an example in which a display apparatus according to an example embodiment is applied to augmented reality glasses.

FIG. 30 illustrates an example in which a display apparatus according to an example embodiment is applied to augmented reality glasses or virtual reality glasses. Augmented reality glasses 9300 may include a projection system 9310 that forms an image, and an element 9320 that guides the image from the projection system 9310 into a user's eye. The projection system 9310 may include the display apparatus described with reference to FIGS. 1 to 26.

Figure 31:
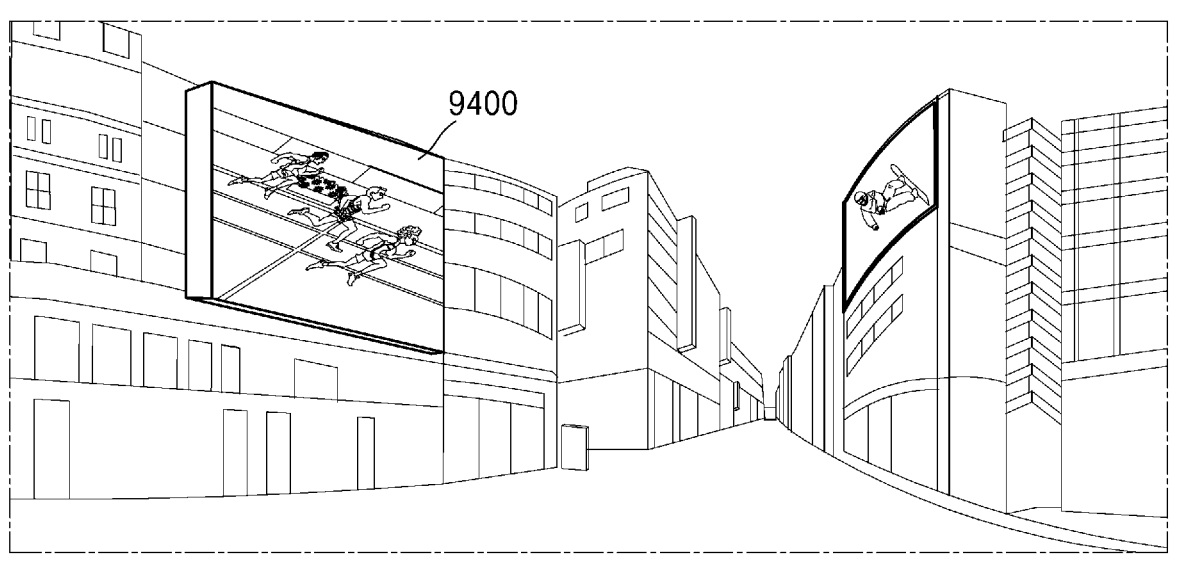
FIG. 31 is a view of an example in which a display apparatus according to an example embodiment is applied to a signage.

FIG. 31 illustrates an example in which a display apparatus according to an example embodiment is applied to a large-sized signage. A signage 9400 may be used to display a content (e.g., advertisement content) using a digital information display, in an outdoor environment for example, and may control a display of the content and the like through a communication network. The signage 9400 may be implemented, for example, through the electronic device described with reference to FIG. 27.

Figure 32:
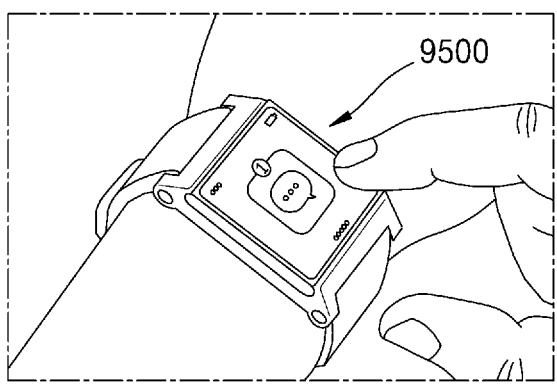
FIG. 32 is a view of an example in which a display apparatus according to an example embodiment is applied to a wearable display.

FIG. 32 is a view of an example in which a display apparatus according to an example embodiment is applied to a wearable display. A wearable display 9500 may include a display apparatus manufactured by the manufacturing method described with reference to FIGS. 1 to 26, and may be implemented through the electronic device described with reference to FIG. 27.

A display apparatus according to an example embodiment may be applied to various products such as a rollable TV and a stretchable display.

A semiconductor device transfer structure according to an example embodiment may include a trap configured to seat a semiconductor device on a substrate, so that the semiconductor device may be efficiently and precisely transferred to the substrate. A semiconductor device transfer structure according to an example embodiment includes a stepped trap in a groove, and semiconductor devices are aligned with the trap, thereby reducing a coupling error rate with an electrode.

A display apparatus according to an example embodiment includes a trap configured to seat a semiconductor device on a substrate, so that the semiconductor device is transferred to an accurate position, thereby reducing a repair rate and increasing productivity.

A method of manufacturing a display apparatus, according to an example embodiment, may efficiently and precisely transfer a semiconductor device to a substrate by using a transfer structure.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A semiconductor device transfer structure comprising:
a substrate;
an alignment layer provided on the substrate and including a trap configured to seat a semiconductor device, the semiconductor device including an electrode; and
a transfer layer provided on an upper surface of the alignment layer and including a groove having a cross-sectional area greater than that of the trap,
wherein the trap is located deeper than the groove, and the trap is located to overlap the groove,
wherein a width of the groove in a horizontal direction is greater than a width of the trap in the horizontal direction, and a portion of the upper surface of the alignment layer is within the groove and exposed from the transfer layer,
wherein the width of the trap in the horizontal direction is greater than a maximum width of the semiconductor device in the horizontal direction and less than or equal to 1.2 times the maximum width of the semiconductor device in the horizontal direction, and
wherein the trap has a depth ranging from 0.1 to 0.2 times a depth of the groove.

2. The semiconductor device transfer structure of claim 1, wherein the groove has a size to include two or more semiconductor devices, and the trap comprises two or more traps to accommodate the two or more semiconductor devices, respectively.

3. The semiconductor device transfer structure of claim 1, wherein the substrate is integrally formed with the alignment layer.

4. The semiconductor device transfer structure of claim 1, wherein the depth of the trap corresponds to 0.1 to 0.2 times a thickness of the semiconductor device.

5. The semiconductor device transfer structure of claim 1, wherein the depth of the groove is greater than or equal to 0.5 times a thickness of the semiconductor device, and is less than 1 times the thickness of the semiconductor device.

6. The semiconductor device transfer structure of claim 1, wherein the trap is arranged to deviate from a center of the groove to one side of the groove.

7. The semiconductor device transfer structure of claim 1, wherein the side wall of the trap and a side wall of the groove extend orthogonal to a top surface of the substrate, and the side wall of the trap and the side wall of the groove are coplanar with respect to each other.

8. A display apparatus comprising:
a substrate;

an alignment layer provided on the substrate and including a trap configured to seat a semiconductor device;

a transfer layer provided on an upper surface of the alignment layer and including a groove having a cross-sectional area greater than that of the trap;

a semiconductor device arranged in the trap, the semiconductor device comprising an electrode; and a driving circuit configured to drive the semiconductor device, wherein the trap is located deeper than the groove, and the trap is located to overlap the groove, wherein a width of the groove in a horizontal direction is greater than a width of the trap in the horizontal direction, and a portion of the upper surface of the alignment layer is within the groove and exposed from the transfer layer, wherein the width of the trap in the horizontal direction is greater than a maximum width of the semiconductor device in the horizontal direction and less than or equal to 1.2 times the maximum width of the semiconductor device in the horizontal direction, and wherein the trap has a depth ranging from 0.1 to 0.2 times a depth of the groove.

9. The display apparatus of claim 8, wherein the groove has a size to include two or more semiconductor devices, and the trap comprises two or more traps to accommodate the two or more semiconductor devices, respectively.

10. The display apparatus of claim 8, wherein the substrate is integrally formed with the alignment layer.

11. The display apparatus of claim 8, wherein the depth of the groove is greater than or equal to 0.5 times a thickness of the semiconductor device, and is less than 1 times the thickness of the semiconductor device.

12. The display apparatus of claim 8, wherein the trap is arranged to deviate from a center of the groove to one side of the groove.

13. The display apparatus of claim 8, wherein the driving circuit is provided in the substrate.

14. The display apparatus of claim 8, wherein the semiconductor device includes at least one of a light emitting diode (LED), a complementary metal-oxide semiconductor (CMOS), a CMOS image sensor (CIS), a vertical-cavity surface-emitting laser (VCSEL), a photodiode (PD), a memory device, or a two-dimensional (2D) material device.

15. A method of manufacturing a display apparatus, the method comprising:

forming an alignment layer including a trap on a substrate;

forming a transfer layer on an upper surface of the alignment layer and including a groove that is stepped with respect to the trap, the transfer layer having a cross-sectional area greater than a cross-sectional area of the trap;

positioning a semiconductor device in the groove, the semiconductor device including an electrode; and aligning the semiconductor device with the trap, wherein a width of the groove in a horizontal direction is greater than a width of the trap in the horizontal direction, and a portion of the upper surface of the alignment layer is within the groove and exposed from the transfer layer, wherein the width of the trap in the horizontal direction is greater than a maximum width of the semiconductor device in the horizontal direction and less than or equal to 1.2 times the maximum width of the semiconductor device in the horizontal direction, and wherein the trap has a depth ranging from 0.1 to 0.2 times a depth of the groove.

16. The method of claim 15, wherein the groove has a size to include two or more semiconductor devices, and the trap comprises two or more traps to accommodate the two or more semiconductor devices, respectively.

17. The method of claim 15, wherein the trap has a depth corresponding to 0.1 to 0.2 times a thickness of the semiconductor device.

* * * * *